(12) United States Patent
Maenishi

(10) Patent No.: US 8,527,082 B2
(45) Date of Patent: Sep. 3, 2013

(54) COMPONENT MOUNTING METHOD, COMPONENT MOUNTING APPARATUS, METHOD FOR DETERMINING MOUNTING CONDITIONS, AND APPARATUS AND PROGRAM FOR DETERMINING MOUNTING CONDITIONS

(75) Inventor: Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 922 days.

(21) Appl. No.: 12/600,574

(22) PCT Filed: May 20, 2008

(86) PCT No.: PCT/JP2008/001250
§ 371 (c)(1),
(2), (4) Date: Nov. 17, 2009

(87) PCT Pub. No.: WO2008/142864
PCT Pub. Date: Nov. 27, 2008

(65) Prior Publication Data
US 2010/0152877 A1    Jun. 17, 2010

(30) Foreign Application Priority Data

May 24, 2007  (JP) ................................. 2007-138341
Jul. 12, 2007  (JP) ................................. 2007-183657

(51) Int. Cl.
*G06F 19/00*    (2011.01)
*H01R 43/00*    (2006.01)

(52) U.S. Cl.
USPC ........................................... 700/108; 29/825

(58) Field of Classification Search
USPC ......................................................... 700/108
See application file for complete search history.

(56) References Cited

U.S. PATENT DOCUMENTS

| 5,920,387 | A | * | 7/1999 | Nakajo et al. ............... 356/237.4 |
| 6,317,972 | B1 | * | 11/2001 | Asai et al. ........................ 29/833 |
| 6,839,960 | B2 | | 1/2005 | Hidese et al. |
| 6,918,176 | B2 | | 7/2005 | Nagao et al. |

(Continued)

FOREIGN PATENT DOCUMENTS

| JP | 02-129537 | 5/1990 |
| JP | 06-53694 | 2/1994 |

(Continued)

OTHER PUBLICATIONS

Partial English translation of JP 2008-060249, Mar. 2008.

(Continued)

*Primary Examiner* — Kimberly Wilson
(74) *Attorney, Agent, or Firm* — Wenderoth, Lind & Ponack, L.L.P.

(57) ABSTRACT

A component mounting method for mounting a component on a substrate is used by a component mounter including a mounting head mounting the component on the substrate, and an inspection head inspecting a surface status of the substrate. The component mounting method includes repeatedly mounting a component to be mounted on a predetermined substrate by the mounting head, determining whether or not the component to be mounted is a predetermined component, and when the determination is made that the component to be mounted is the predetermined component, performing at least one of inspecting a mounting status of the predetermined component after mounting the predetermined component and inspecting a status of a mounting surface on which the predetermined component is to be mounted, before mounting the predetermined component.

2 Claims, 23 Drawing Sheets

(56) References Cited

U.S. PATENT DOCUMENTS

| | | | |
|---|---|---|---|
| 6,999,835 B2 * | 2/2006 | Kodama | 700/121 |
| 7,059,043 B2 | 6/2006 | Hidese et al. | |
| 7,440,812 B2 * | 10/2008 | Yano et al. | 700/108 |
| 7,966,718 B2 | 6/2011 | Kodama et al. | |
| 2002/0014003 A1 | 2/2002 | Asai et al. | |
| 2002/0046462 A1 | 4/2002 | Inoue et al. | |
| 2002/0138977 A1 | 10/2002 | Nagao et al. | |
| 2003/0029033 A1 | 2/2003 | Hidese et al. | |
| 2003/0110623 A1 | 6/2003 | Haji et al. | |
| 2003/0177633 A1 * | 9/2003 | Haji et al. | 29/743 |
| 2004/0085701 A1 | 5/2004 | Inoue et al. | |
| 2004/0205961 A1 | 10/2004 | Haji et al. | |
| 2005/0015975 A1 | 1/2005 | Inoue et al. | |
| 2005/0108873 A1 | 5/2005 | Hidese et al. | |
| 2006/0018531 A1 * | 1/2006 | Murakami et al. | 382/145 |
| 2006/0085973 A1 | 4/2006 | Kodama et al. | |
| 2006/0119118 A1 * | 6/2006 | Hata et al. | 294/64.1 |

FOREIGN PATENT DOCUMENTS

| | | |
|---|---|---|
| JP | 11-330798 | 11/1999 |
| JP | 2002-084097 | 3/2002 |
| JP | 2002-299889 | 10/2002 |
| JP | 2003-060396 | 2/2003 |
| JP | 2003-060397 | 2/2003 |
| JP | 2003-188594 | 7/2003 |
| JP | 2004-221518 | 8/2004 |
| JP | 2004-281717 | 10/2004 |
| JP | 3656533 | 6/2005 |
| JP | 3755458 | 3/2006 |
| JP | 2006-319332 | 11/2006 |
| JP | 3928381 | 6/2007 |
| JP | 2008-060249 | 3/2008 |

OTHER PUBLICATIONS

Partial English translation of JP 2006-319332, Nov. 2006.
International Search Report issued Jun. 17, 2008 in International (PCT) Application No. PCT/JP2008/001250.

* cited by examiner

| Mounting Number | Task Number | Component Type | Mounting Coordinates (X,Y) | Component Size (X,Y) |
|---|---|---|---|---|
| 1 | 1 | A1 | (10, 20) | (0.3, 0.6) |
| 2 | 1 | A1 | (10, 22) | (0.3, 0.6) |
| --- | --- | --- | --- | --- |
| 8 | 2 | CSP1 | (100, 180) | (30, 50) |
| 9 | 2 | CSP1 | (200, 250) | (30, 50) |
| --- | --- | --- | --- | --- |
| N | P | B1 | (50, 60) | (1, 2) |

COMPONENT MOUNTING METHOD, COMPONENT MOUNTING APPARATUS, METHOD FOR DETERMINING MOUNTING CONDITIONS, AND APPARATUS AND PROGRAM FOR DETERMINING MOUNTING CONDITIONS

BACKGROUND OF THE INVENTION

I. Technical Field

The present invention relates to component mounting methods for mounting components on a substrate.

II. Description of the Related Art

A mounted-substrate manufacturing system, which manufactures substrates on each of which components are mounted (hereinafter, referred to as "component mounted substrates" or "mounted substrates"), includes; a printer that prints solder paste on each substrate; mounters that mounts components on the substrate with printed solder paste; and a reflow machine that solders the mounted components.

Substrates to be mounted with components are transported on a line of a conveyer in the mounted-substrate manufacturing system and manufactured as mounted substrates in the conveyer system. More specifically, respective machines perform their processes for each substrate. For example, for each substrate, the printer prints solder paste on the substrate, the mounter mounts various-sized numerous components on the substrate, and then the reflow machine solders the components. Each of the mounted substrates is manufactured in a series of manufacturing processes performed by these machines. Such a mounted substrate manufactured in the above-described manner is eventually embedded in an end product such as a home appliance.

This mounted-substrate manufacturing system sometimes produces defective component mounted substrates. From among various causes of poor quality, there is a defect in printing solder paste. For example, if a defect occurs in printing solder paste on a substrate but subsequent processes are performed on the printed substrate, in more details, components are mounted and soldered on the substrate, this results in various wastes in use of the mounted-substrate manufacturing system, consumption of the components, and the like.

To reduce the number of defective products and reduce waste processes in the mounted-substrate manufacturing system, it is effective to detect the occurrence of a defect in an early stage and take measures when the defect occurs in the middle of a series of the manufacturing processes.

Conventionally, there is a technology by which an inspection machine arranged for a process subsequent to a printing process inspects how a printer prints solder paste on each substrate. In another technology, an inspection machine arranged for a process subsequent to a mounting process inspects how a component mounter mounts components on each substrate. In a still another technology, a camera provided to a component mounter captures an image from above, then before mounting components, based on the image it is inspected how solder paste is printed on each substrate, and mounting positions of the components are corrected based on positional deviation of the detected solder paste. An example of these technologies is disclosed in Japanese Patent No. 3656533. If the above-mentioned technology detects that the positional deviation of solder paste is too large to be adjusted simply by correcting the mounting positions, it is one of measures that processing for the substrate is terminated to stop subsequent processes. For example, the substrate is removed from the path.

SUMMARY OF THE INVENTION

The inspection machine arranged among machines such as mounters as disclosed in the above technologies can improve inspection accuracy and reduce a defective rate. However, such an inspection machine makes the mounted-substrate manufacturing system longer, and a time required for the inspection affects throughputs.

Furthermore, when a trouble occurs in a machine, the trouble can be detected only after the machine completes all processes. For example, there is a situation where a component falls on a substrate during a mounting process and unnecessary parts are short-circuited. The technology of inspecting a printing status using a camera provided to a component mounter as disclosed in Japanese Patent No. 3656533 cannot detect such a fall of a component during a mounting process.

There is another situation where a fine component falls on a substrate during a mounting process, and then a relatively large component such as a Chip Size Package (CSP) is mounted, so that the fine component is trapped between the large component and the substrate. Such a defect where a large component traps a fine component (hereinafter, referred to as a "trap defect") can hardly be detected merely by checking a manufactured mounted substrate based on an image captured from above. Therefore, such a mounted substrate with the trap defect passes inspection as having good quality in the mounted-substrate manufacturing system, and then embedded in an end product such as a home appliance. Then, when a function of the home appliance is inspected, it is found that the mounted substrate is defective. Eventually, not only processes after mounting the large component in the mounted-substrate manufacturing system, but also processes related with the end product having the substrate are wasted. It is common that various processes are performed after such a trap defect occurs. This reduces manufacturing efficiency.

Moreover, the trap defect sometimes damages the trapping large component and the damaged component cannot be re-used. For example, the trapping large component such as a CSP shorts out and destroyed due to the trapped fine component. Since the destroyed component cannot be used again, the trap defect causes a cost loss.

Thus, the present invention solves the problems of the conventional techniques as described above. It is an object of the present invention to provide a component mounting method by which a cause of poor quality of a component mounted substrate can be detected in an early stage and thereby manufacturing efficiency is improved.

In accordance with an aspect of the present invention for achieving the object, there is provided a component mounting method of mounting a component on a substrate, the component mounting method including: mounting a component to be mounted on a substrate that is predetermined, the mounting being repeated; determining whether or not the component to be mounted is a predetermined component; and when the determination is made that the component to be mounted is the predetermined component, performing at least one of (i) inspecting a mounting status of the predetermined component after mounting the predetermined component and (ii) inspecting a status of a mounting surface on which the predetermined component is to be mounted, before mounting the predetermined component.

By the above method, the surface status of the substrate is inspected during the mounting processing performed by the component mounter. Thereby, the surface status of the substrate can be inspected at a desired timing. As a result, it is possible to immediately detect a defect occurring during mounting components or a cause of the defect.

In addition, the inspection is performed during picking up components or transporting a component. Thereby, the mounting processing and the inspection can be performed alternately. As a result, the inspection can be performed almost without affecting the time required for the component mounter to mount components.

Furthermore, immediately before mounting a predetermined component such as a CSP, it is inspected whether or not a different component falls near a position at which the predetermined component is to be mounted. Thereby, since the detection of the fall enables the substrate with the fall to be removed from a manufacturing line processing for the substrate, it is possible to prevent a defect caused by trapping the different component between the predetermined component and the substrate.

It is preferable that the component mounting method is used by a component mounter including: a mounting head mounting the component on the substrate; and an inspection head inspecting at least one of surface statuses of the substrate, the mounting head and the inspection head being arranged facing each other and being movable independently, and the mounting head is a line gang pickup head capable of picking up a plurality of components including the component at once, wherein the mounting includes: picking up the plurality of components at once; transporting the plurality of components to above the substrate; and mounting the plurality of components on the substrate, the picking up, the transporting, and the mounting forming a series of operations in a task that is repeated by the mounting head, and in the inspecting of the mounting status, the mounting status is inspected during the picking up or the transporting after completing the task for a subsequent component to be mounted subsequent to the predetermined component, the mounting status being one of the surface statuses.

By the above method, the inspecting is performed after completing each task included in the mounting. Thereby, the inspection head can inspect the surface status of the substrate while the mounting head picks up components. In other words, the inspection head can inspect the substrate when the mounting head does not perform any processing for the substrate. As a result, it is possible to reduce poor quality of a resulting component-mounted substrate almost without affecting a time required for the component mounter to mount components on the substrate.

In addition, in the inspecting, the mounting status of a component is inspected as a surface status of the substrate. Thereby, it is possible to detect a deviation of a mounting position of each component mounted in each task, or detect whether or not each component to be mounted in each task has been actually mounted, for example. An amount of the detected deviation is fed back to modify the mounting position for a next task. As a result, it is possible to modify a deviation of a position in real time. In addition, if it is possible to detect that a component that should have been mounted is not actually mounted, it is possible to change a nozzle or re-mount the component.

It is also preferable that the component mounting method is used by a component mounter including: a mounting head mounting the component on the substrate; and an inspection head inspecting at least one of surface statuses of the substrate, the mounting head and the inspection head being arranged facing each other and being movable independently, and the mounting head is a line gang pickup head capable of picking up a plurality of components including the component at once, wherein the mounting includes: picking up the plurality of components at once; transporting the plurality of components to above the substrate; and mounting the plurality of components on the substrate; the picking up, the transporting, and the mounting being performed by the mounting head and forming a series of operations in a task, the task being repeated by the mounting head, and in the inspecting of the status of the mounting surface, the status of the mounting surface is inspected during the picking up or the transporting before starting the task for the predetermined component, the status of the mounting surface being one of the surface statuses.

By the above method, the surface status of the substrate is inspected before starting each task performed by the line gang pickup head. Thereby, it is possible to inspect whether or not there is any component falling near any of mounting positions of components to be mounted in a next task. If there is such a component falling near any of mounting positions of components to be mounted in a next task, it is possible to remove the falling component and then mount the components in the next task, or not to execute the next task for the substrate, for example. Thereby, a trap defect can be prevented.

It is further preferable that the component mounting method is used by a component mounter including: a mounting head mounting the component on the substrate; and an inspection head inspecting at least one of surface statuses of the substrate, the mounting head and the inspection head being arranged facing each other and being movable independently, wherein the mounting includes: picking up a plurality of components including the component at once; transporting the plurality of components to above the substrate; and mounting the plurality of components on the substrate; the picking up, the transporting, and the mounting being performed by the mounting head and forming a series of operations in a task, the task being repeated by the mounting head, and in the inspecting of the status of the mounting surface, the status of the mounting surface is inspected during a period (i) from completion of the mounting of components immediately prior to the predetermined component (ii) to start of the mounting of the predetermined component within the same task performed by the mounting head, the status of the mounting surface being one of the surface statuses.

By the above method, the mounting status is inspected immediately after mounting predetermined components. Thereby, a cause of a defect occurring during the mounting can be detected immediately after the mounting. As a result, the defect can be detected at the early stage.

In accordance with another aspect of the present invention for achieving the object, there is provided a component mounter that mounts a component on a substrate, the component mounter including: a mounting unit configured to mount a component to be mounted on a substrate that is predetermined, the mounting being repeated; a determination unit configured to determine whether or not the component to be mounted is a predetermined component; and an inspection unit configured to, when the determination unit determines that the component to be mounted is the predetermined component, perform at least one of (i) inspecting a mounting status of the predetermined component after mounting the predetermined component and (ii) inspecting a status of a mounting surface on which the predetermined component is to be mounted, before mounting the predetermined component.

It is further preferable that the component mounter mounts the component by alternately moving a plurality of heads to above the substrate, wherein the mounting unit is a mounting head mounting the component on the substrate, the inspection unit is an inspection head inspecting the substrate, an operation time period required for the mounting head to mount the component on the substrate is longer than an operation time period required for the inspection head to inspect the substrate above the substrate, and a home position of the mounting head and a home position of the inspection head are set to satisfy a relationship that a distance from the home position of the mounting head to the substrate is equal to or longer than a distance from the home position of the inspection head to the substrate.

By the above method, the mounting head is arranged so that a distance from the home position of the mounting head to the substrate is shorter than a distance from the home position of the inspection head to the substrate, and the inspection head is arranged so that a distance from the home position of the inspection head to the substrate is longer than the distance from the home position of the mounting head to the substrate. Thereby, a travel time period of the mounting head to reach the substrate is shorter than a travel time period of the inspection head to reach the substrate. Moreover, an operation time period required for the mounting head to mount components on the substrate is longer than an operation time period required for the inspection head to inspect the substrate above the substrate. This reduces a difference between (a) the operation time period of the mounting head including the travel time period for reaching the substrate and (b) the operation time period of the inspection head for reaching the substrate. It is preferable that the operation time periods are substantially equalized. In addition, the mounting head and the processing performing head (the inspection head) alternately go to above the substrate to perform the component mounting and the inspection processing. Thereby, it is possible to minimize a waste time in which the mounting head and the inspection head are idle. As a result, a takt time required for the component mounter to manufacture a circuit board (component-mounted substrate) can be shortened.

It should be noted that the present invention can also be implemented as a component mounter including units that perform steps included in the above component mounting method. The present invention can further be implemented as a program causing a computer to execute the steps included in the component mounting method. The program can be distributed by a recording medium such as a Compact Disc-Read Only Memory (CD-ROM) or by a transmission medium such as the Internet.

It should also be noted that the "task" also refers to a series of processes which include; picking up components by a line gang pickup head, transporting the pick-up components to respective mounting positions; and mounting the transported components on a target substrate. Transporting and mounting are repeated in a single task until all pick-up components for the task have been mounted.

Here, a Chip Size Package (CSP) is one kind of electronic components, and includes a Dual In-Line Package (DIP), a Small Outline Package (SOP), a Ball Grid Array (BGA), and the like.

The present invention can detect occurrence of a cause of a defect or occurrence of the defect during mounting, thereby detecting the defect in an early stage. As a result, manufacturing efficiency can be improved.

BRIEF DESCRIPTION OF DRAWINGS

FIG. 7 is a table showing a part of mounting data.

DETAILED DESCRIPTION OF THE INVENTION

First Embodiment

The following describes the first embodiment according to the present invention with reference to the drawings.

Figure 1:
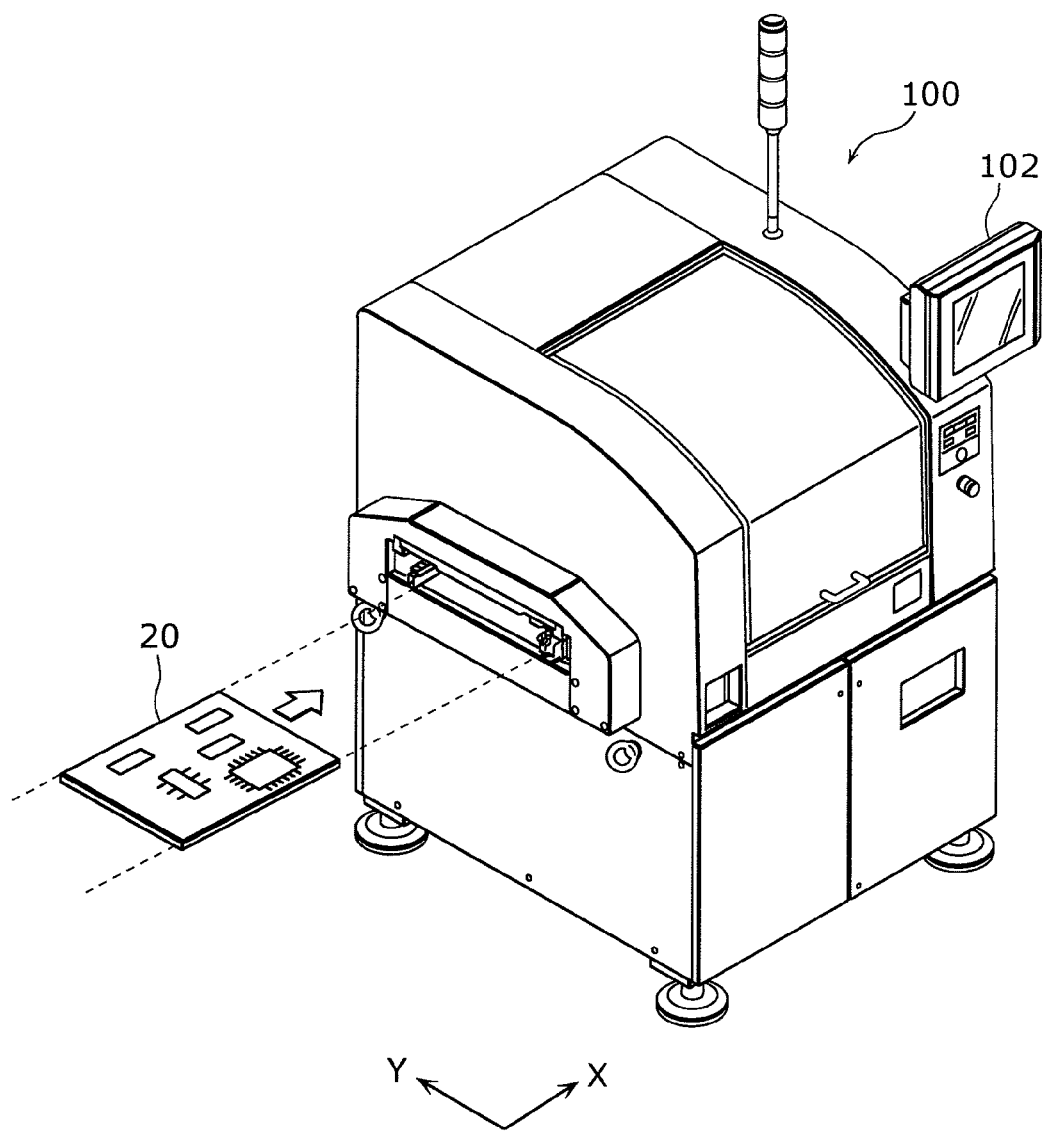
FIG. 1 is an external perspective view of a component mounter.

FIG. 1 is an external perspective view of a component mounter.

The component mounter 100 is a machine which mounts components on a substrate 20 that has been transported on a conveyer (not shown) in an X direction, and inspects a status of a surface of the substrate 20. The component mounter 100 is one of machines which form equipment for manufacturing component mounted substrates as half-finished products on each of which components are mounted.

The component mounter 100 includes a display unit 102 that displays a result of inspecting the surface status of the substrate 20. Examples of the display unit 102 are a Cathode-Ray Tube (CRT), a Liquid Crystal Display (LCD), and the like.

Figure 2:
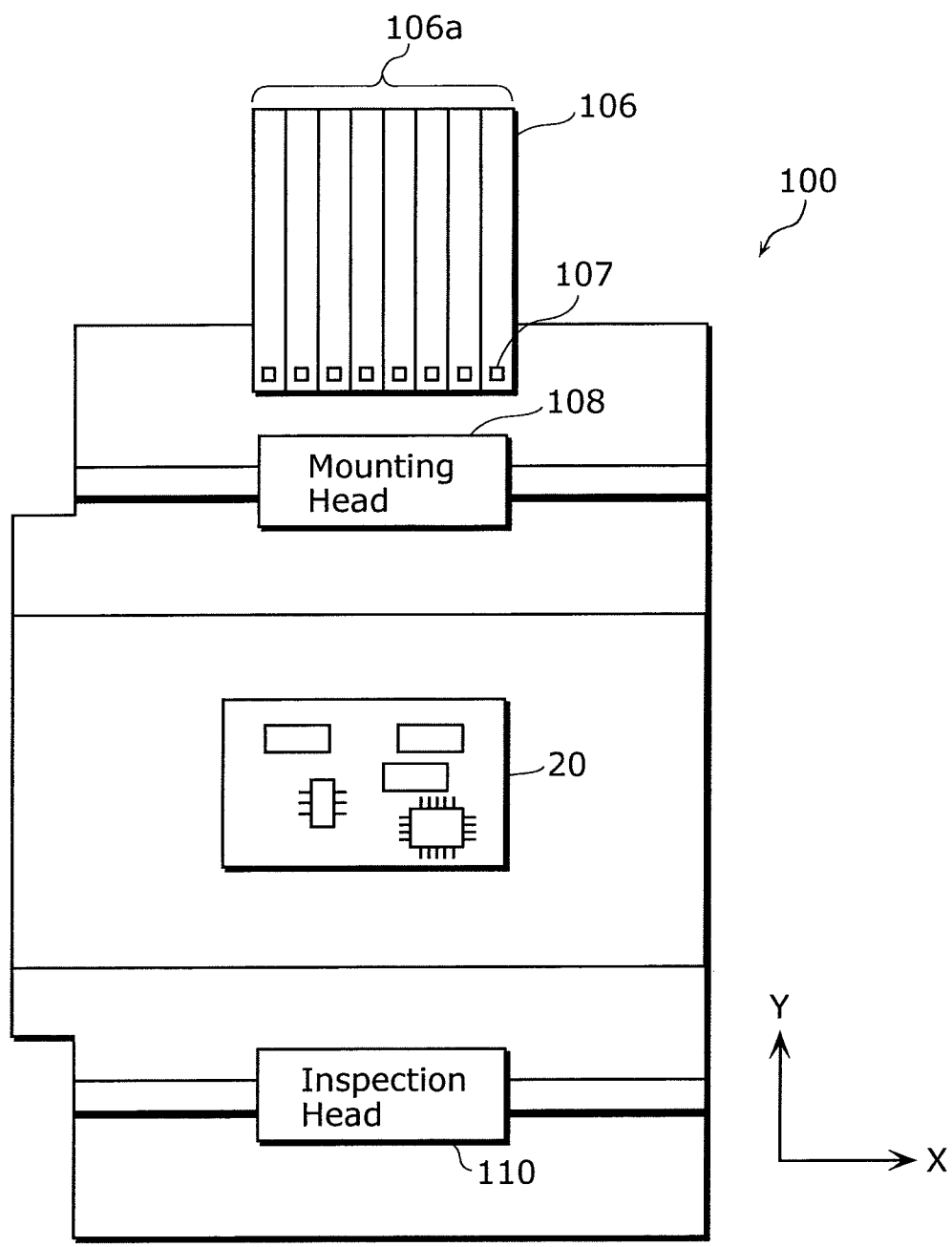
FIG. 2 is a schematic plain view of a structure of the component mounter.

FIG. 2 is a schematic plain view of a structure of the component mounter.

The component mounter 100 includes; a mounting head 108 that mounts components on a substrate 20; an inspection head 110 that inspects a surface of the substrate 20; and a component supplying unit 106a that supplies the components.

The mounting head 108 is a line gang pickup head that picks up components supplied from the component supplying unit 106a, transports the pick-up components by being moved in the X-Y direction by a structure, and mounts the transported components on the substrate 20.

The inspection head 110 is a camera that is moved by a structure in the X-Y direction to capture an image from above of the substrate 20.

The mounting head 108 and the inspection head 110 are arranged on an almost same horizontal plane, facing a transportation path for the substrate 20. The mounting head 108 and the inspection head 110 can be moved independently.

The component supplying unit 106a is provided with a plurality of feeders 106 each of which can supply components sequentially.

The mounting head 108 is described with reference to FIG. 3.

Figure 3:
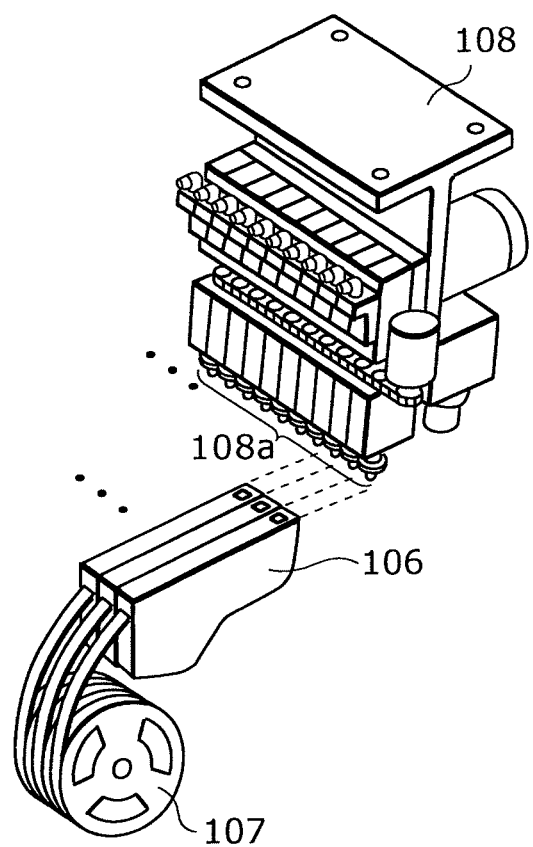
FIG. 3 is an external perspective view of a mounting head and a feeder.

FIG. 3 is an external perspective view of the mounting head 108 and the feeder 106.

The feeder 106 is a device that is provided with a component reel 107 around which a component tape arranged with components has been wound, and that supplies the components sequentially to respective positions to be picked up by the mounting head 108. The component supplying unit 106a may be provided with a component tray holding components.

The mounting head 108 has a tip end with a nozzle group 108a. Using vacuum suction, each nozzle in the nozzle group 108a picks up a component supplied from the component supplying unit 106a. Each nozzle can pick up one component, and the mounting head 108 can pick up components at once depending on the number of the nozzles in the nozzle group 108a. The nozzle group 108a in the mounting head 108 shown in FIG. 3 has 10 nozzles, so that the mounting head 108 can pick up 10 components at maximum at once. If a shape or a size of each nozzle in the nozzle group 108a provided to the mounting head 108 is changed depending on a size, a weight, or a shape of a corresponding component, the mounting head 108 can pick up components with various sizes or shapes.

Next, the inspection head 110 is described with reference to FIGS. 4 and 5.

Figure 4:
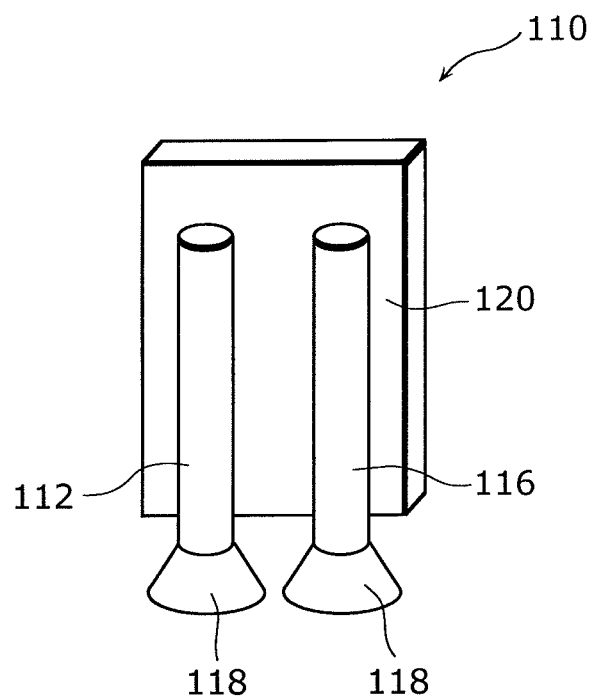
FIG. 4 is an external perspective view of an inspection head.

FIG. 4 is an external perspective view of the inspection head 110.

Figure 5:
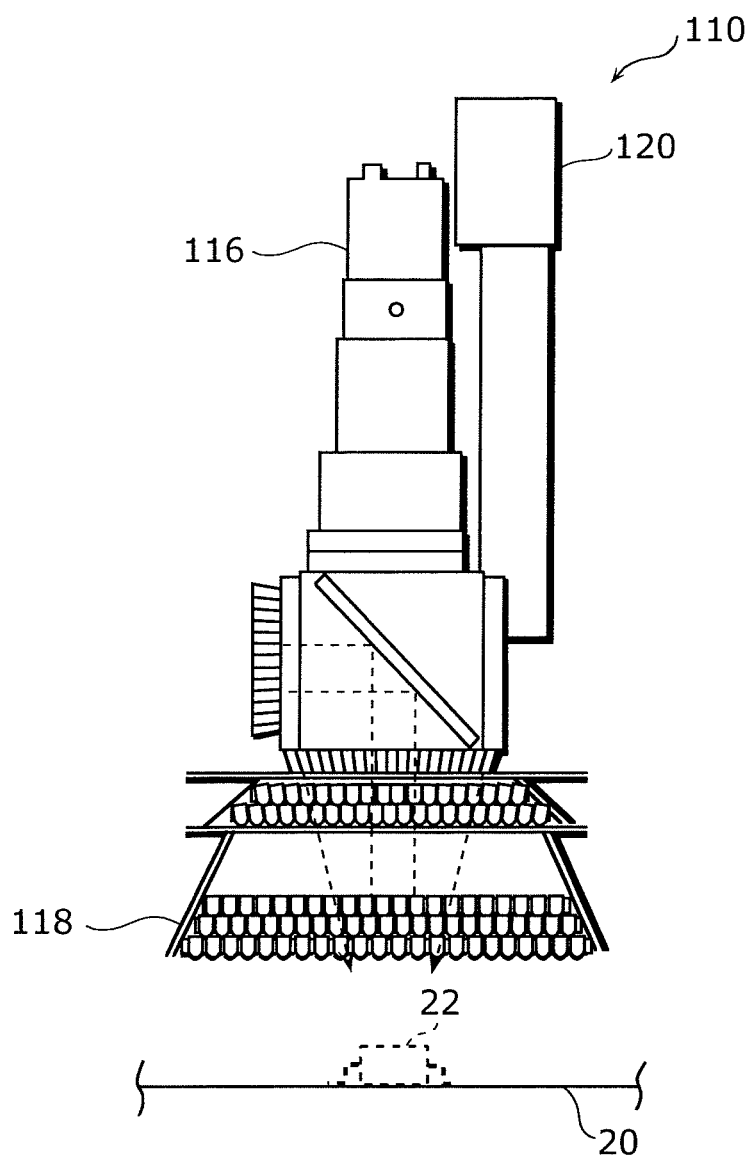
FIG. 5 is a side view showing details of the inspection head.

FIG. 5 is a cross-sectional view of a partial side of the inspection head 110.

The inspection head 110 has a base 120, and two cameras 112 and 116 provided to the base 120. The first camera 112 and the second camera 116 have different resolutions. The first camera 112 has a low resolution, and the second camera 116 has a high resolution. Each of the first camera 112 and the second camera 116 has a tip end provided with a ring illumination 118.

The first camera 112 and the second camera 116 are switched to be used depending on a size of a component. If it is inspected whether or not a small component having a size equal to or less than a threshold value falls on a substrate, or if it is inspected whether a mounting position of a small component is deviated from a proper position, the second camera 116 having a high resolution is used. On the other hand, if it is inspected whether a mounting position of a large component having a size greater than a threshold value is deviated from a proper position, the first camera 112 having a low resolution is used.

In general, a low-resolution camera has a visual view wider than that of a high-resolution camera. Therefore, by switching the cameras having different resolutions to be used depending on a size of a component, it is possible to achieve both of (i) accurate inspection for small components and (ii) efficient inspection using a wide visual view.

It should be noted that the first camera 112 and the second camera 116 may be implemented as a single camera having a zoom function.

Each ring illumination 118 provided in the first camera 112 and the second camera 116 is a Light Emitting Diode (LED) arranged in a ring shape surrounding a lens of the corresponding camera. The ring illumination 118 can adjust a light volume. When inspecting by the camera 116 (112), the light volume of the ring illumination 118 is adjusted depending on a resolution of the camera 116 (112) or a status of an object such as a substrate 20 or a component 22.

Thereby, it is possible to capture an image suitable for the inspection, thereby improving accuracy of inspection.

Figure 6:
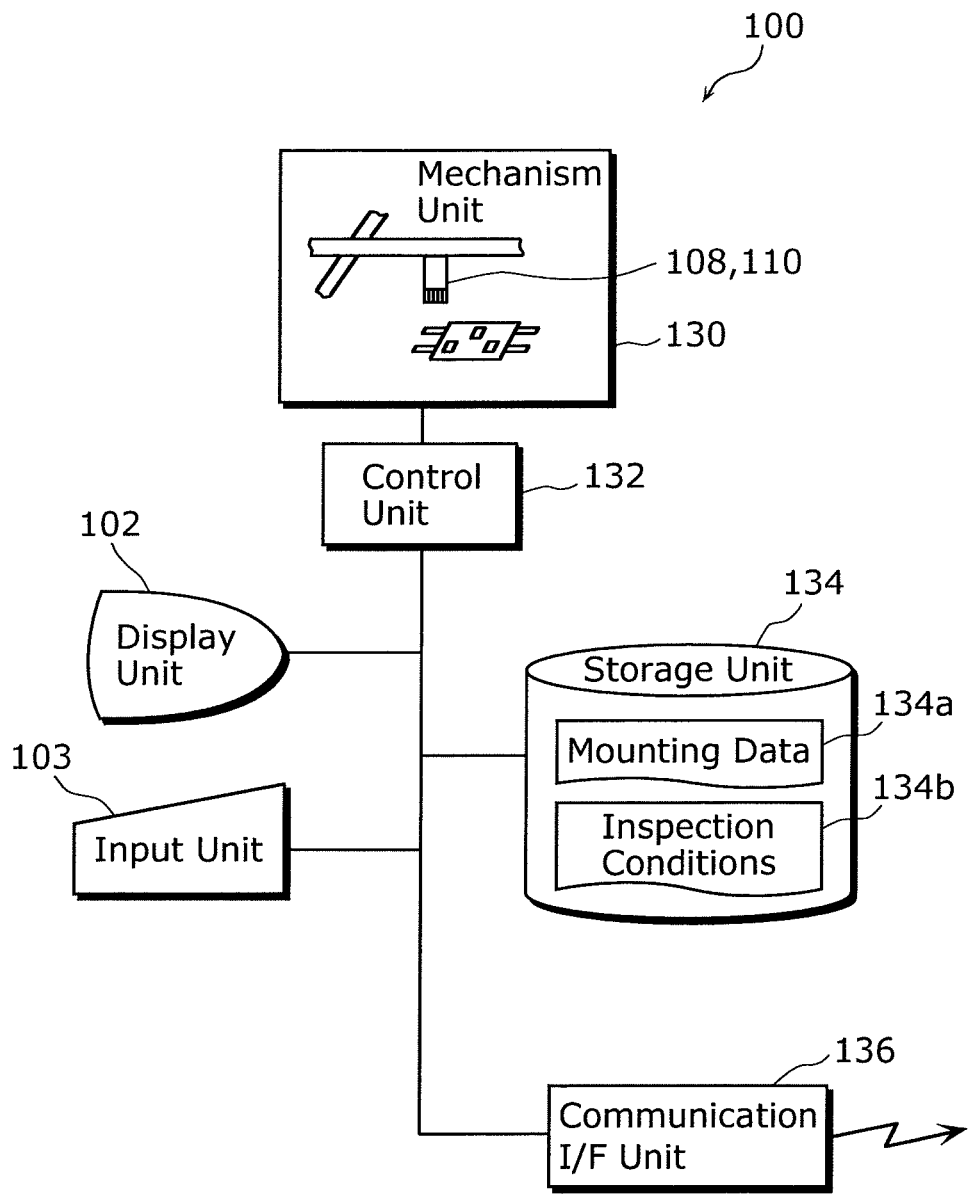
FIG. 6 is a block diagram showing a structure of the component mounter.

FIG. 6 is a block diagram showing a structure of the component mounter 100.

The component mounter 100 includes an input unit 103, a mechanism unit 130, a storage unit 134, a control unit 132, a communication I/F unit 136, and a display unit 102.

The input unit 103 is an interface enable to input or change inspection conditions that will be described later. Examples of the input unit 103 are a keyboard, a touch panel, a mouse, and the like.

The storage unit 134 is a storage medium that stores mounting data 134a indicating information regarding components to be mounted on a substrate, inspection conditions 134b indicating conditions for determining an inspection region of the inspection head 110 and a kind of a camera to be used, and the like.

FIG. 7 is a table showing a part of the mounting data 134a.

The mounting data 134a shown in FIG. 7 is information regarding components to be mounted in a single mounting process, namely, information regarding components to be mounted on a single substrate 20 by a single component mounter 100. The mounting data 134a includes a "mounting number", a "task number", a "component type", "mounting coordinates", and a "component size". The mounting head 108 mounts components according to the mounting data 134a.

The "mounting number" is information for identifying each mounting point.

The "task number" is information for identifying each task included in a single mounting process. Here, the "task" means a series of operations including: picking up components at once; transporting the pick-up components to above a target substrate; and mounting the transported components on the substrate. Or, the "task" means the components to be mounted on the substrate 20 in the series of operations.

The "component type" is information indicating a type of a component to be mounted on each mounting point (mounting number).

The "mounting coordinates" are information for indicating a position on the substrate, at which each component is to be mounted.

The "mounting coordinates" indicate a position on the substrate, at which the center of each component is to be mounted.

The "component size" is information indicating a size of a component.

It is also possible that the "mounting coordinates" and the "component size" are used to calculate a region on a substrate to be mounted with a component, namely, a region to be occupied by the component on the substrate, and that the calculated information is included in the mounting data 134a as "mounting region information". Furthermore, the mounting data 134a may include a component library in addition to the information shown in FIG. 7.

FIG. 7 shows an example of only a part of components to be mounted in each task. Each task includes the mounting data 134a regarding components to be mounted by the nozzle group 108a in the mounting head 108. In the first embodiment, since the nozzle group 108a in the mounting head 108 has 10 nozzles as described above, each task includes the mounting data 134a corresponding to 10 mounting positions at maximum.

The mounting data 134a shown in FIG. 7 indicates, for example, that a component with a "mounting number" having a value of "1" is mounted in a task "1" on a position that is "10" millimeters in an X direction from a reference position of the substrate and "20" millimeters in a Y direction from the reference position. The mounting data 134a also shows that the component with the "mounting number" having a value of "1" has a "component type" having "A1", and that a size of the component is "0.3" millimeters in an X direction and "0.6" millimeters in a Y direction.

With reference to such mounting data 134a, it is possible to determine which part on the substrate is to be inspected, by inspecting a mounting status of already-mounted components, or by inspecting a status of a mounted surface that is a surface status of the substrate to be mounted with components.

Figure 8:
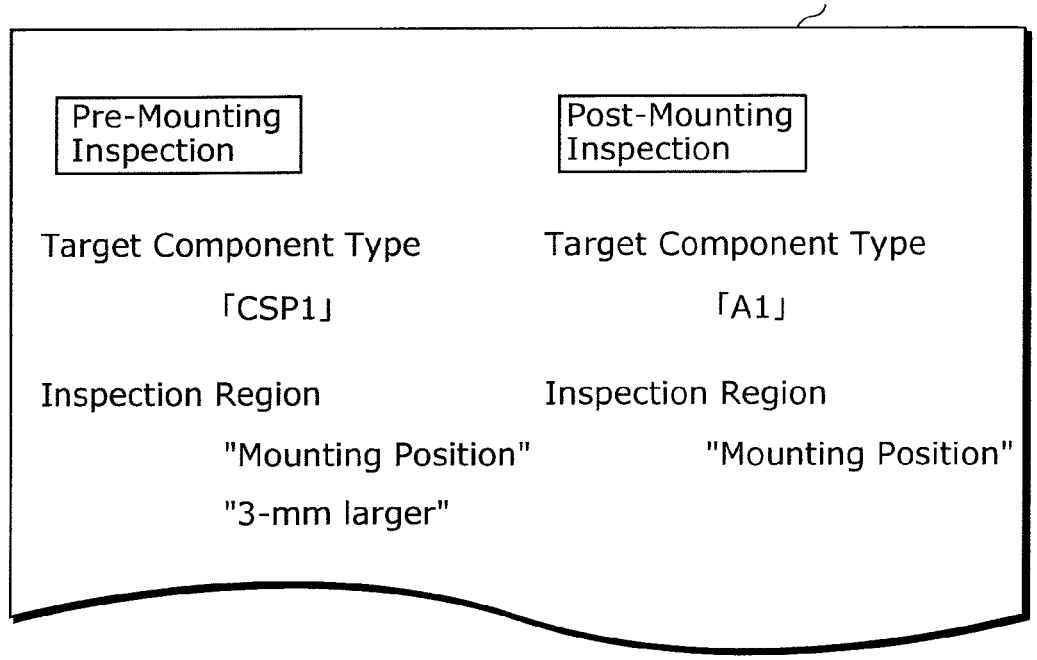
FIG. 8 is a diagram of an example of inspection conditions.

FIG. 8 is a diagram of an example of the inspection conditions 134b.

The inspection conditions are used to determine a timing, an inspection region, and the like of inspection performed by the inspection head 110. The inspection conditions include, for example, information for identifying components to be inspected in the pre-mounting inspection and post-mounting inspection.

For information for identifying components to be inspected in the pre-mounting inspection, the inspection conditions 134b according to the first embodiment indicates that a "target component type" is "CSP1" and that an inspection region is expressed by a "mounting position" of a component of the identified component type and "3-mm larger" than a mounting area of the component. This means that the inspection region for the pre-mounting inspection according to the first embodiment is a region expanded by 3 millimeters (mm) from a mounting area of the component having the center that is the mounting position. The identifying a component type to be inspected in the pre-mounting inspection makes it possible to select components to be inspected, so that only components of the identified component type "CSP1" are inspected in the pre-mounting inspection but components of any other component types are not inspected in the pre-mounting inspection.

In addition, for information for identifying components to be inspected in the post-mounting inspection, the inspection conditions 134b indicates that a "target component type" is "A1" and that an inspection region is expressed by a "mounting position" of a component of the identified component type. The identifying a component type to be inspected in the post-mounting inspection makes it possible to select components to be inspected, so that only components of the identified component type "A1" are inspected in the post-mounting inspection but components of any other component types are not inspected in the post-mounting inspection.

It is also possible that the inspection conditions 134b sets inspection conditions for either the pre-mounting inspection or the post-mounting inspection. In this case, in the inspection for which inspection conditions are not set, it can be considered that there is no component to be inspected or that components of all component types are to be inspected.

Figure 9:
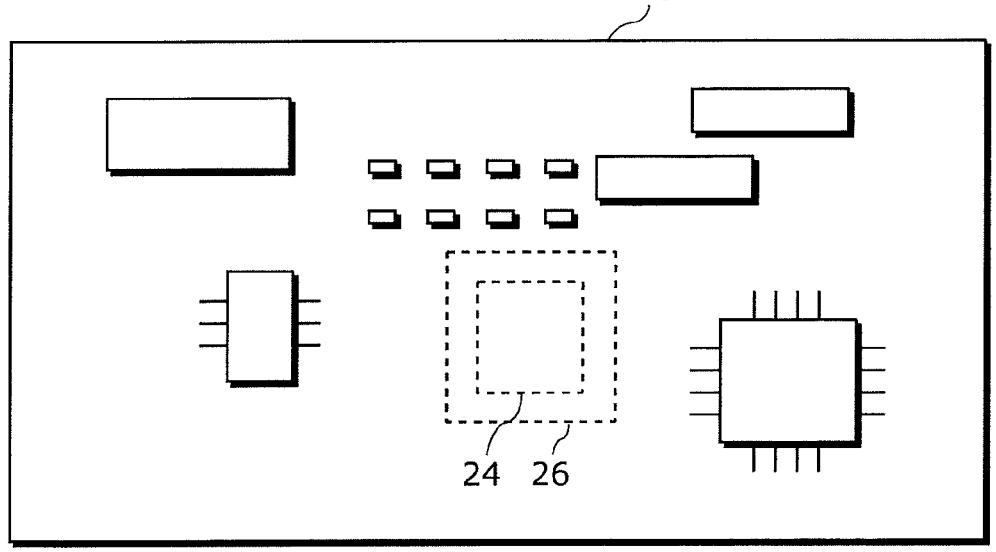
FIG. 9 is a diagram of an example of an inspection region on a substrate 20 determined based on inspection conditions.

FIG. 9 is a diagram of an example of an inspection region determined on a substrate 20 according to the inspection conditions 134b. When a single component "CSP1" is to be mounted at a mounting position (mounting area) 24 on the substrate 20, an inspection region for the component is determined to be the inside of an outer dotted outline 26 that is determined by expanding the mounting area 24 (namely, an outline of the mounted component) by 3 mm.

The inspection conditions 134b are information inputted by the input unit 103. The inspection conditions 134b may be predetermined or obtained via a network.

By referring back to FIG. 6, functions of the component mounter 100 are described.

The mechanism unit 130 includes the mounting head 108 and the inspection head 110 which has been described above.

The control unit 132 is a processing unit that controls the entire component mounter 100. An example of the control unit 132 is a Central Processing Unit (CPU). Based on information stored in the storage unit 134, the control unit 132 controls the mechanism unit 130 to cause the mounting head 108 to mount components on a substrate 20 and cause the inspection head 110 to inspect a status of the surface of a substrate 20 (hereinafter, referred to also as a "surface status"). The processing performed by the control unit 132 will be described later in more detail.

The communication interface (I/F) unit 136 is an interface for communicating with other machines, a host computer (not shown), and the like in the mounted-substrate manufacturing system. An example of the communication I/F unit 136 is an adaptor of a Local Area Network (LAN).

The display unit 102 displays a result of the inspection of the surface status of a substrate 20.

With the above-described functions, the component mounter 100 can inspect the surface status of a substrate 20 during mounting processing.

The processing performed by the component mounter 100 is described with reference to FIG. 10.

Figure 10:
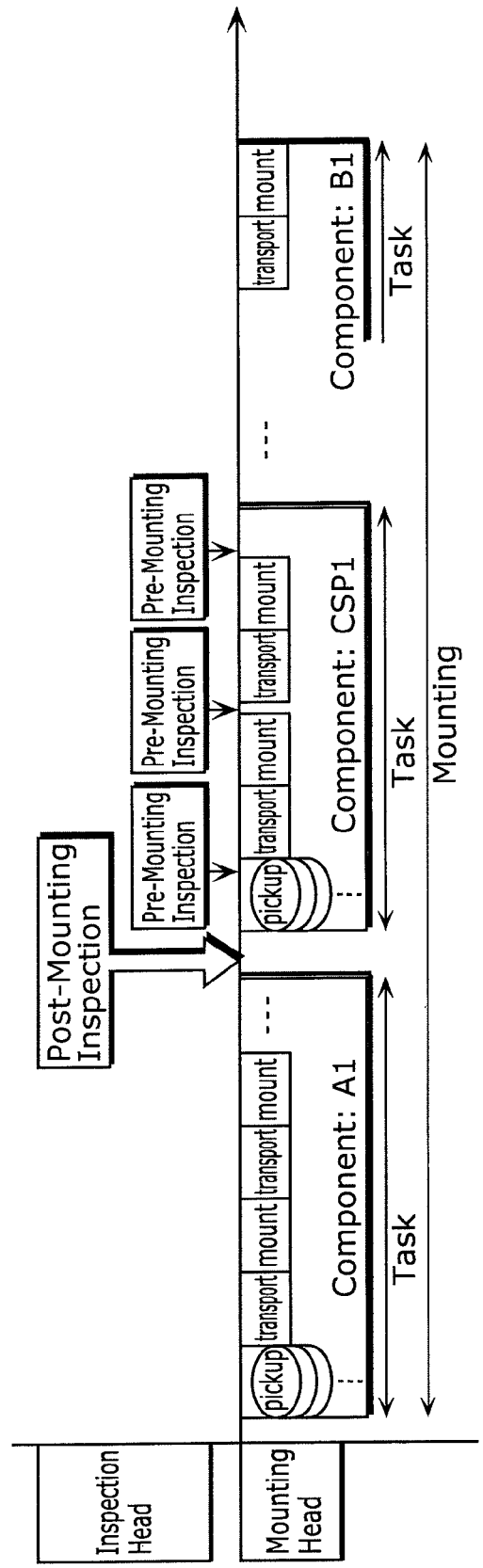
FIG. 10 is a diagram of a flow of processing performed by the component mounter.

FIG. 10 is a diagram of a flow of processing performed by the component mounter 100.

FIG. 10 shows processing performed by the component mounter 100 for mounting components on a substrate 20 according to the mounting data 134a.

The inspection conditions used in the first embodiment are the inspection conditions 134b shown in FIG. 8. In the inspection conditions shown in FIG. 8, a "target component type (target component type for the pre-mounting inspection)" is "CSP1" and a "target component type (target component type for the post-mounting inspection)" is "A1". As seen in the mounting data 134a shown in FIG. 7, a component size of "CSP1" that is a "target component type" for the pre-mounting inspection is smaller than component sizes of other component types such as "A1" and "B1".

For the pre-mounting inspection, the control unit 132 determines a "mounting position (mounting area)" of each component of the component type "CSP1" and an inspection region expanding by 3 mm from each mounting area, based on the inspection conditions. Here, the outer dotted outline 26 shown in FIG. 9 is an inspection region for one of components of the component type "CSP1". In the post-mounting inspection, the control unit 132 determines a "mounting position (mounting area)" of each component of the component type "A1" as an inspection region.

According to the mounting data 134a stored in the storage unit 134, the control unit 132 firstly executes a task having a "task number" that is "1".

In the first task, components of the "component type" that is "A1" (hereinafter, referred to as a "component A1") are mounted. Since the inspection conditions 134b shown in FIG. 8 indicates the component type "A1" as a target component type for the post-mounting inspection, the components A1 are inspected after the first task is completed.

The mounting head 108 picks up a group of components to be mounted in the first task. The pick-up components are transported to above a target substrate 20. The mounting head 108 repeats transportation and mounting to eventually mount all of the pick-up components on the substrate 20. Then, the mounting head 108 moves to the component supplying unit 106a to pick up a next group of components to be mounted. On the other hand, the inspection head 110 starts moving to above the substrate 20 at the almost same time when the mounting head 108 moves to the component supplying unit 106a, and inspects the components A1 mounted in the first task.

As described above, the inspection of component mounting status can be performed during a time period in which the mounting head 108 is moving to the component supplying unit 106a, in other words, during a time period in which the mounting head 108 does not perform component mounting. In addition, the inspection head 110 needs to inspect the mounting status only for one task (10 positions at maximum in the first embodiment). Thereby, it is possible to improve quality of the resulting mounted substrate without significantly wasting task time.

Furthermore, components are mounted in an order so that the mounting head 108 moves at minimum. Therefore, the inspection head 110 can perform the inspection in the order for a minimum move.

Here, the post-mounting inspection is described in more detail with reference to FIG. 11.

Figure 11:
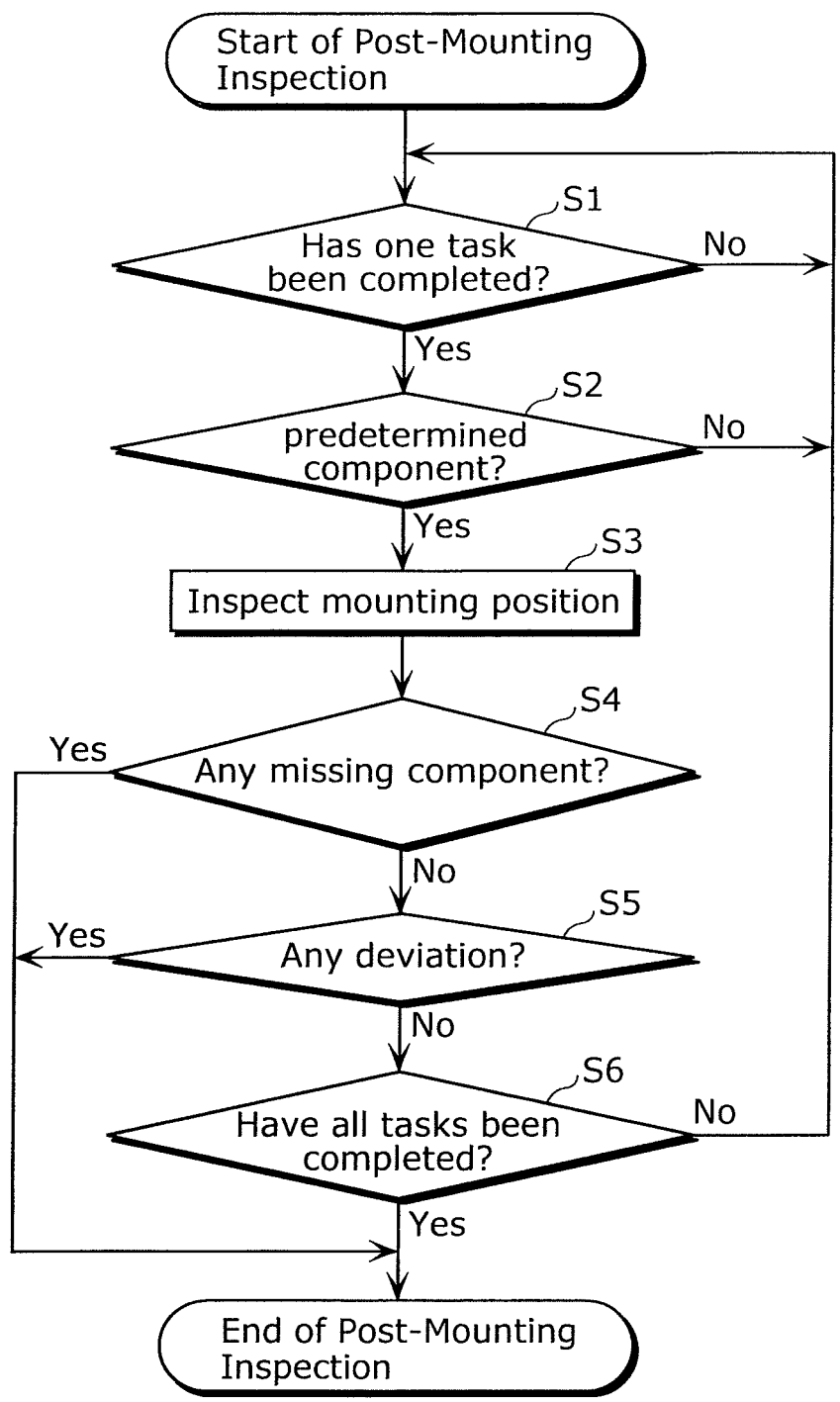
FIG. 11 is a flowchart of post-mounting inspection performed by a control unit included in the component mounter.

FIG. 11 is a flowchart of the post-mounting inspection performed by the control unit 132 included in the component mounter 100. The post-mounting inspection is processing of inspecting a mounting status of a component after mounting the component.

The control unit 132 determines whether or not mounting for one task has been completed (S1). The determination is made based on signals from the mechanism unit 130.

If a determination is made that mounting for one task has not yet been completed (No at S1), in other words, if the control unit 132 does not receive, from the mechanism unit 130, signals indicating completion of mounting in response to a last mounting instruction in one task, then the control unit 132 continues the step S1 of determining mounting completion.

On the other hand, if a determination is made that mounting for one task has been completed (Yes at S1), in other words, if the control unit 132 receives, from the mechanism unit 130, the signals indicating completion of the mounting in response to a last mounting instruction in one task, then the control unit 132 further determines whether or not components mounted in the task are components of a predetermined component type (hereinafter, referred to also as "predetermined components") (S2). For example, when the first task is completed, the control unit 132 determines that the mounted components in the first task are components of a predetermined component type A1, because a component type of the components mounted in the first task is "A1" and a "target component type" for the post-mounting inspection indicated in the inspection conditions is also the same "A1".

If a determination is made that the components mounted in the task are not predetermined components (No at S2), then the control unit 132 returns to the step S1 of determining mounting completion.

On the other hand, if a determination is made that the components mounted in the task are predetermined components (Yes at S2), then the control unit 132 controls the inspection head 110 to inspect a mounting status of each predetermined component, according to the mounting data 134a regarding the task for which mounting has been completed (S3) (here, if the signals indicating mounting completion are received, the mounting head moves to the component supplying unit 106a for a next task). For example, the control unit 132 controls the inspection head 110 to capture an image of the respective mounting positions of the components A1 mounted in the first task and thereby inspect a mounting status of the components A1 at the respective mounting positions. In this case, the control unit 132 moves the inspection head 110 to have a visual field enough to capture the plurality of mounting positions. Thereby, based on the single image generated by the inspection head 110, it is possible to inspect mounting status of the components A1 at the various mounting positions. This achieves high-speed inspection of mounting status. It should be noted that the control unit 132 may move the inspection head 110 for each of the mounting positions. Thereby, based on a single image generated by the inspection head 110, it is possible to inspect mounting status of a component A1 at a single mounting position. By this method, a high-resolution image can be generated for each mounting position. As a result, the mounting status of the component A1 can be inspected with a high accuracy.

Based on the image generated by the inspection head 110 to show a mounting status, the control unit 132 determines whether or not all components are mounted on respective mounting positions (S4).

If all components are not mounted on the respective mounting positions, in other words, if there is any missing component that should have been mounted (Yes at S4), then the control unit 132 terminates processing for the substrate 20. Then, the control unit 132 causes the display unit 102 to display the result of the determination, and sends the result of the determination to machines and a host computer included in the mounted-substrate manufacturing system via the communication I/F unit 136. In addition, a component type and the deviated mounting position of the missing component are informed to the host computer. Thereby, processing subsequent to the processing of the component mounter 100 is canceled, and the occurrence of the trouble and an amount of the deviation (deviation amount) are recorded on the host computer. The host computer may calculate statistics of the deviation amount and use the statistics for feedback control.

Based on the image generated by the inspection head 110 to show the mounting status, the control unit 132 further determines whether or not the deviation from the proper mounting position exceeds an allowable limit (S5). Here, the allowable limit for deviation from a mounting position is predetermined and recorded as a part of the mounting data 134a in the component mounter 100.

If a determination is made that the deviation from the proper mounting position exceeds the allowable limit (Yes at S5), then the control unit 132 terminates the processing for the substrate 20. Then, the control unit 132 causes the display unit 102 to display the result of the determination, and sends the result of the determination to the machines and the host computer included in the mounted-substrate manufacturing system via the communication I/F unit 136. In addition, an amount of the deviation (deviation amount) is informed to the host computer. Thereby, processing subsequent to the processing of the component mounter 100 is canceled, and the occurrence of the trouble and the deviation amount are recorded on the host computer. The host computer may calculate statistics of the deviation amount and use the statistics for feedback control.

If a determination is made that the deviation from the proper mounting position does not exceed the allowable limit (No at S5), then the control unit 132 further determines whether or not the component mounter 100 completes all tasks (S6).

If a determination is made that the component mounter 100 completes all tasks (Yes at S6), then the control unit 132 completes the processing for the substrate 20.

On the other hand, if a determination is made that the component mounter 100 has not yet completed all tasks (No at S6), then the control unit 132 returns to the step S1 of determining mounting completion.

By the above processing, it is possible to detect whether or not there is any missing fine component immediately after mounting processing, because such a fine component would fall on a mounting position of a large component (CSP, for example) to be subsequently mounted and cause a trap defect. As a result, trap defects can be prevented.

In addition, immediately after mounting processing, it is possible to detect whether or not a component requiring a high mounting accuracy (for example, a fine component or a component with a narrow lead pitch) is deviated from a proper mounting position. That can prevent waste of performing subsequent processing for a substrate with a positional deviation defect (error).

Moreover, since the post-mounting inspection is performed only for the above-mentioned predetermined components but not for other components, the post-mounting inspection can be performed when needed. As a result, unnecessary inspection can be eliminated and thereby the component mounting can be performed efficiently.

It should be note that the post-mounting inspection may detect causes or status of other defects in stead of (or in addition to) deviation of a mounting position, based on the image showing a mounting status. For example, it is possible to detect whether or not any component to be mounted falls on the substrate 20.

Furthermore, according to the present invention, when any component to be mounted falls on the substrate 20, the display unit 102 or the like notifies a user of the defect by displaying fall position information indicating where the component falls on the substrate 20.

It should also be noted that the post-mounting inspection shown in FIG. 11 is performed for all predetermined components after each task is completed, but the post-mounting inspection may be performed for each of the predetermined components immediately after mounting the target component, in other words, during a time period from mounting of the target component to mounting a next component. In this case, the number of inspection takt times is more than that in the case where the post-mounting inspection is performed at once for all predetermined components. However, an error in mounting a predetermined component can be detected immediately after mounting the component. Therefore, it is possible to prevent that subsequent components scheduled to be mounted after the component with a mounting error are actually mounted. As a result, waste of mounting the subsequent components can be prevented.

By referring back to FIG. 10, the processing performed by the component mounter 100 is described.

In the first task, since a component type of components to be mounted is not "CSP1", the pre-mounting inspection (which will be described later) is not performed.

Next, according to the mounting data 134a stored in the storage unit 134, the control unit 132 secondly executes a task having a "task number" that is "2".

In the second task, components having a "component type" that is "CSP1" are mounted.

The mounting head 108 picks up a group of components to be mounted in the second task.

Here, the control unit 132 controls the inspection head 110 to perform the pre-mounting inspection before executing the second task, in parallel to the control of the mounting head 108 to pick up the components. As described above, the picking-up processing included in the processing performed by the mounting head 108 is performed in parallel to the inspection performed by the inspection head 110. Thereby, the substrate 20 can be inspected almost without affecting a time required for component mounting, and poor in quality of the resulting component mounted substrate can be reduced.

Here, the pre-mounting inspection is described in more detail with reference to FIG. 12.

Figure 12:
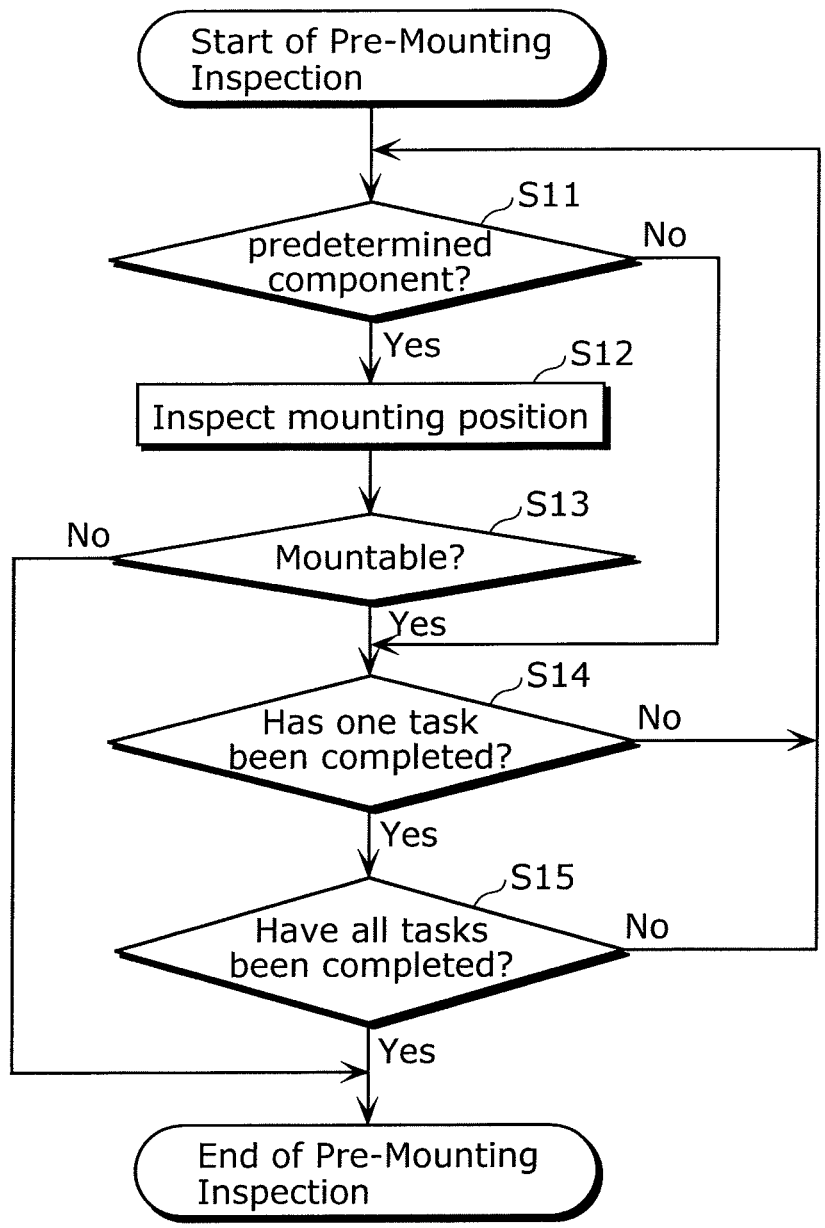
FIG. 12 is a flowchart of soldering inspection performed by the control unit included in the component mounter.

FIG. 12 is a flowchart of the pre-mounting inspection performed by the control unit 132 included in the component mounter 100. The pre-mounting inspection is performed to inspect, for each task, a status of a to-be-mounted surface of an inspection region determined according to the inspection conditions on a substrate, before mounting a specific component.

According to the inspection conditions, the control unit 132 determines whether or not a component to be mounted is a component of a predetermined component type (S1). Since a component type of the component to be mounted is "CSP1" and a "target component type" for the pre-mounting inspection indicated in the inspection conditions 134b is also the same "CSP1", the control unit 132 determines the component to be mounted as being the predetermined component.

If a determination is made that the component to be mounted is the predetermined component (Yes at S11), then the control unit 132 controls the inspection head 110 to capture an image of a mounting position of the predetermined component and thereby inspect the mounting position (S12). In other words, the control unit 132 moves the inspection head 110 to a predetermined position (a mounting position of the component to be mounted, namely, a target component for the pre-mounting inspection) on the substrate 20, and captures an image of the to-be-mounted surface. Then, based on the image information showing the status of the to-be-mounted surface of the inspection region on the substrate 20, it is determined whether or not the target component to be mounted can be mounted on the surface. For the determination, pattern matching is performed between an image of a surface which is properly printed and the captured image, and based on a difference between these images, it is determined whether or not the target component can be mounted on the surface.

At the step S12 of inspecting a mounting position, if the control unit 132 detects fall of a component on the inspection region on the substrate 20 or positional deviation of solder paste which exceeds an allowable limit, then the control unit 132 determines that the target component cannot be mounted on the surface (No at S13), and then terminates the processing for the substrate 20. More specifically, the control unit 132 stops the mounted-substrate manufacturing system, for example. The substrate 20 is removed from the line of the mounted-substrate manufacturing system by an operator or automatically.

On the other hand, if the control unit 132 does not detect any fall of a component on the inspection region on the substrate 20 or any positional deviation of solder paste which exceeds an allowable limit, then the control unit 132 determines that the target component can be mounted on the surface (Yes at S13), and then further determines whether or not the mounting head 108 has mounted all components for one task (S14). If a determination is made that the component to be mounted is not the predetermined component (No at S11), then the control unit 132 performs the step S14 of determining mounting completion.

If a determination is made that the mounting head 108 has not yet mounted all components for one task (No at S14), then the control unit 132 returns to the step S11 of determining a predetermined component.

On the other hand, if a determination is made that the mounting head 108 has mounted all components for one task (Yes at S14), then the control unit 132 further determines whether or not the component mounter 100 has completed all tasks (S15).

If a determination is made that the component mounter 100 has not yet completed all tasks (No at S15), then the control unit 132 returns to the step S11 of determining a predetermined component.

On the other hand, if a determination is made that the component mounter 100 has completed all tasks (Yes at S15), then the control unit 132 completes the processing for the substrate 20.

As described above, the pre-mounting inspection described with reference to FIG. 12 is performed for each predetermined component immediately before mounting the component. In the pre-mounting inspection for each predetermined component, it is possible to inspect a mounting position of a component immediately before mounting the component, although the inspection causes a takt time loss. As a result, it is possible to prevent a trap defect caused by a fine component falling on the substrate in previous mounting processing.

Figure 13:
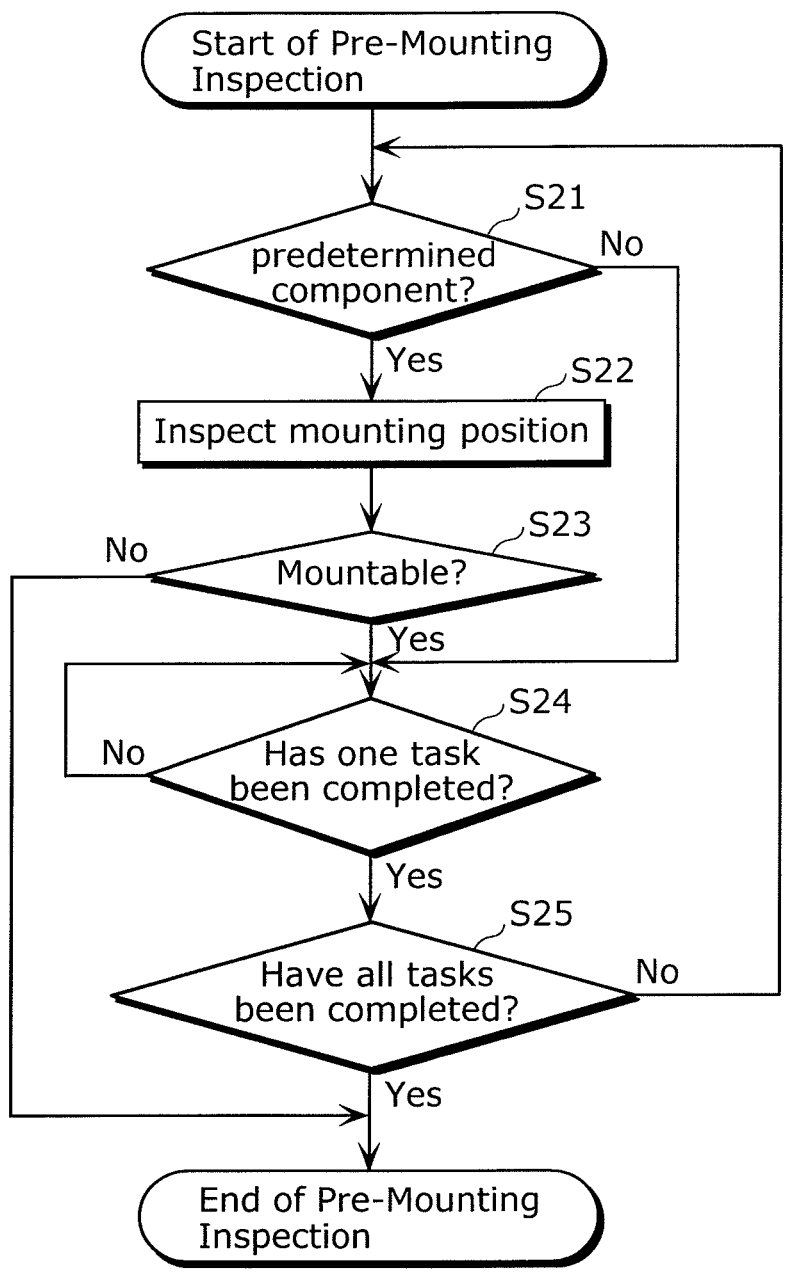
FIG. 13 is a flowchart of another soldering inspection performed by the control unit included in the component mounter.

It should be noted that the pre-mounting inspection may be performed at once for all predetermined components of each task before executing the task. FIG. 13 is a flowchart of the pre-mounting inspection performed by the control unit 132 included in the component mounter 100 before executing a target task.

According to the inspection conditions, the control unit 132 determines whether or not components to be mounted in a target task to be executed are predetermined components (S21). For example, when the target task is the second task, the control unit 132 determines that components to be mounted in the target task are predetermined components CSP1, because a component type of the components to be mounted in the second task is "CSP1" and a "target component type" for the pre-mounting inspection indicated in the inspection conditions is also the same "CSP1".

If a determination is made that the components to be mounted are predetermined components (Yes at S21), then the control unit 132 controls the inspection head to capture an image of mounting positions of the predetermined components and thereby inspect the respective mounting positions (S22). The step S22 of inspecting mounting positions is basically the same as the step S12 in FIG. 12 of inspecting a mounting position. However, likewise the post-mounting inspection described with reference to FIG. 11, at the step S22, the inspection head may capture a single image for the plurality of mounting positions and thereby perform inspection, or capture an image for each of the mounting positions thereby perform inspection.

At the step S22 of inspecting mounting positions, if the control unit 132 detects fall of a component on the inspection region on the substrate 20 or positional deviation of solder paste which exceeds an allowable limit, then the control unit 132 determines that the components to be mounted cannot be mounted on the surface of the substrate 20 (No at S23), and then terminates the processing for the substrate 20. More specifically, the control unit 132 stops the mounted-substrate manufacturing system, for example. The substrate 20 is removed from the line of the mounted-substrate manufacturing system by an operator or automatically.

On the other hand, if the control unit 132 does not detect any fall of a component on the inspection region on the substrate 20 or any positional deviation of solder paste which exceeds an allowable limit, then the control unit 132 determines that the components to be mounted can be mounted on the surface of the substrate 20 (Yes at S23), and then waits until the mounting head 108 has mounted all components for the target task (S24).

If a determination is made that the mounting head 108 has mounted all of the components for the target task (Yes at S24), then the control unit 132 further determines whether or not the component mounter 100 has completed all tasks (S25).

If a determination is made that the component mounter 100 has not yet completed all tasks (No at S25), then the control unit 132 returns to the step S21 of determining predetermined components.

On the other hand, if a determination is made that the component mounter 100 has completed all tasks (Yes at S25), then the control unit 132 completes the pre-mounting inspection for the substrate 20.

The pre-mounting inspection described with reference to FIG. 13 is performed at once for a plurality of predetermined components before executing the target task. As described above, since the pre-mounting inspection is performed at once for all predetermined components in a target task before executing the target task, the inspection head 110 can perform the pre-mounting inspection while the mounting head 108 picks up the components and a recognition camera recognizes the components picked up by the mounting head 108. As a result, the pre-mounting inspection does not cause a takt time loss.

It should be noted that a determination as to which inspection of (i) the pre-mounting inspection of the flowchart of FIG. 12 which is performed for each predetermined component immediately before mounting the component and (ii) the pre-mounting inspection of the flowchart of FIG. 13 which is performed at once for all predetermined components in the target task before executing the target task is to be performed can be made in the following manner. When a fine chip component is to be mounted before mounting a predetermined component in the same task, the pre-mounting inspection is performed for each predetermined component immediately before mounting the predetermined component, so that a trap defect can be surely detected. On the other hand, when a fine chip component is not to be mounted before mounting a predetermined component in the same task, the pre-mounting inspection is performed at once for all predetermined components before executing the target task, because a trap defect is unlikely to occur in such a situation.

As described above, in the pre-mounting inspection, based on the image generated by the inspection head 110, it is inspected whether or not a component falls on a mounting region (occupation region) for a component to be mounted next, and whether or not a status of printed solder paste on a mounting position for a component to be mounted next is defective, for example.

If there is no fall of a component on an inspection region and a status of printed solder paste is good, a component to be mounted is transported and mounted by the mounting head 108. Then, inspection for solder paste, transportation, and mounting are repeated until all of pick-up components have been mounted.

According to the mounting data 134a stored in the storage unit 134, the control unit 132 repeats the above-described task processing up to a task having a "task number" that is "N". When the component mounter 100 has executed tasks to mount all components to be mounted on the substrate 20, the mounting processing for the substrate 20 by the component mounter 100 is completed.

As described above, the pre-mounting inspection is performed during mounting of components in a task or before mounting components in a task. Thereby, it is possible to prevent a small component from being trapped on the substrate, and to detect, for each task, a defect such as deviation of a mounting position.

Furthermore, since deviation of a mounting position is detected in the post-mounting inspection, the mounting position can be modified in a next task. By modifying positional deviation in real time, a component can be mounted at a proper position.

Still further, since the pre-mounting inspection is performed only for predetermined components, the pre-mounting inspection can be performed for a large component (CSP, for example) immediately before mounting the large component, when such a large component would have a trap defect if a fine component falls on a mounting position of the large component. As a result, trap defects can be prevented.

Still further, since the pre-mounting inspection is performed only for predetermined components, not for other components, the pre-mounting inspection can be performed when needed. As a result, unnecessary inspection can be eliminated and thereby the component mounting can be performed efficiently.

The above has been described for the component mounter and the component mounting method according to the first embodiment of the present invention. However, the present invention is not limited to the first embodiment.

It should be noted that the mounting head may mount only a single component at once.

It should also be noted that the mounting head may has chucks instead of nozzles, so as to pick up a component.

It should also be noted that it has been described in the first embodiment that components of a single component type are mounted in a single task, but it is also possible that the mounting head picks up components of various component types and mounts them on a substrate subsequently.

It should also be noted that the step S11 of determining predetermined components and step S12 of inspecting mounting positions in the pre-mounting inspection described with reference to FIG. 12 can be performed at any of the following timings.

The step S11 of determining predetermined components and step S12 of inspecting mounting positions can be performed for all target components to be inspected among components to be mounted in a target task. In this case, the processing is as shown in the flowchart of FIG. 13.

When all target components in a target task are processed together, it is possible to reduce a takt time loss caused by the step S11 of determining predetermined components and the step S12 of inspecting mounting positions.

Furthermore, the step S11 of determining predetermined components and step S12 of inspecting mounting positions in the pre-mounting inspection described with reference to FIG. 12 can be performed immediately before mounting each of target components to be inspected. Here, the expression "immediately before mounting each of target components to be inspected" means a time duration from mounting of a component immediately prior to a target component to be inspected to mounting of the target component. In this case, the processing is as shown in the flowchart of FIG. 12.

As described above, immediately before performing each mounting, the step S11 of determining predetermined components and the step of S12 of inspecting mounting positions are performed. Thereby, when components that have been scheduled to be mounted before mounting target components to be inspected wrongly fall on or near mounting positions of the target components, it is possible to detect the fall. Therefore, it is possible to surely detect components falling on wrong mounting positions.

It is also possible that the step S11 of determining predetermined components and the step S12 of inspecting mounting positions which have been described with reference to FIG. 12 are performed for all target components to be inspected among components to be mounted in a target task, and components not to be inspected are mounted after mounting the target components.

When, as described above, the step S11 of determining predetermined components and the step S12 of inspecting mounting positions are performed for all target components in a task, it is possible to reduce a takt time loss caused by the steps S11 and S12. In addition, this makes it possible to minimize the number of components mounted on a substrate after inspecting a status of the surface of the substrate, thereby minimizing a risk of falling components on wrong mounting positions on the substrate before mounting target components to be inspected.

For example, the inspection conditions (inspection conditions for the pre-mounting inspection or the post-mounting inspection) may include a threshold value regarding a component size, as information for determining target components to be inspected. For instance, a large component has a problem of a difficulty in detecting a trapped component after mounting the large component. When a threshold value of a component size is used as the inspection conditions, components having a size larger than the threshold value can be determined as target components. As a result, it is possible to prevent a defect of trapping a small component between a large component and a substrate.

It should also be noted that, in the first embodiment, CSPs have been described as target components for the pre-mounting inspection, but the target components are not limited to CSPs and may be Quad Flat Packages (QFPs), for example. For example, the inspection conditions may include a component type QFP as information for determining target components to be inspected. The inspection conditions may further include a threshold value for determining a location close to a mounting position of a target component. Thereby, existence of a component falling on a location close to a mounting position of a QFP, a status of solder paste of the mounting position, and the like can be detected before mounting the QFP. As a result, it is possible to prevent a defect caused by electrical shorting between a component and leads of a QFP. Here, as far as a target component is large enough to cause electrical shorting when a fine chip component falls in a region around a mounting position of the target component, any components rather than CSPs and QFPs can be target components for the pre-mounting inspection.

It is also possible that the inspection conditions includes a component type QFP and also information indicating whether or not a component of a different type is scheduled to be mounted in a region around a mounting position of a target component to be inspected. Here, the region around a mounting position refers to a region expanded by a predetermined length from the mounting position. Here, the component of a different type is preferably a small component easily trapped between a QFP and a substrate.

As described above, when such a different component is mounted near a QFP, the different component is likely to be trapped due to, for example, an error in mounting the different component. As described above, by inspecting only a region having a possibility of a trap defect, the inspection can be performed efficiently.

Moreover, the inspection conditions may include a threshold value regarding a pitch that is a space between leads of components, as information for determining target components to be inspected. In this case, the mounting data 134a further includes information indicating a pitch for each component type. Thereby, it is possible to inspect a defect in printing solder paste for components arranged at especially narrow pitches. As a result, it is possible to prevent a defect caused by electrical shorting due to soldering which is likely occur in components arranged at narrow pitches.

It should also be noted that it has been described that the inspection is performed between completion of a previous task and start of a next task, but the present invention is not limited to the above. For example, the inspection may be performed during execution of a task, or immediately before mounting a next predetermined component.

In these cases, even if a component that should have been mounted before mounting a predetermined component in the same task falls and thereby is trapped, the trapped status can be detected.

It is also possible that the inspection may be performed immediately after mounting a predetermined component. For example, by inspecting a mounting status immediately after mounting a component having a high possibility of fall, the fall can be detected in real time and processing subsequent to the detection can be cancelled.

Furthermore, when the post-mounting inspection is to be performed for a task that has been just completed and the pre-mounting inspection is to be performed for a task that is to be executed next, both inspections can be performed at the same time. More specifically, while the mounting head 108 picks up components and the recognition camera recognizes the components picked by the mounting head 108, both of the post-mounting inspection and the pre-mounting inspection are performed. Here, if an inspection region of the post-mounting inspection and an inspection region of the pre-mounting inspection are within the same view field of the inspection head 110, the post-mounting inspection and the pre-mounting inspection are performed based on an image generated by capturing a surface of the substrate in the single same view field including these inspection regions. In addition, a moving pathway of the inspection head 110 capturing an image of target regions for the post-mounting inspection and the pre-mounting inspection including the view field position as determined in the above manner is calculated to be minimum. The inspection head 110 moves along the calculated moving pathway.

It should also be noted that it has been described in the first embodiment that the component mounter 100 has the mounting head 108 and the inspection head 110 which operate alternately, but the structure of the component mounter 100 according to the first embodiment is not limited to the above. Instead of the inspection head which performs inspection independently from the mounting head, the component mounter 100 may use any inspection means to perform inspection, as far as the inspection means determines whether or not components of a task are predetermined components and performs pre-mounting inspection or post-mounting inspection when the components are the predetermined components. For example, it is possible that the component mounter 100 has an inspection camera on the mounting head, moves the mounting head to a position where the inspection camera can capture an image of an inspection target region, and then performs pre-mounting inspection or post-mounting inspection using the inspection camera.

It is further possible to apply a component mounting method known as POP mounting in the first embodiment. In the POP mounting, a second component is mounted on a top surface of a first component that has already been mounted. More specifically, the pre-mounting inspection can be performed for the second component before mounting the second component, by inspecting whether or not an inspection region that is the top surface of the first component has a foreign object or a defect.

Second Embodiment

The following describes a component mounter according to the second embodiment of the present invention. The elements identical to the elements in the first embodiment are not described again below.

An external view of the component mounter according to the second embodiment is the same as the view of FIG. 1.

Figure 14:
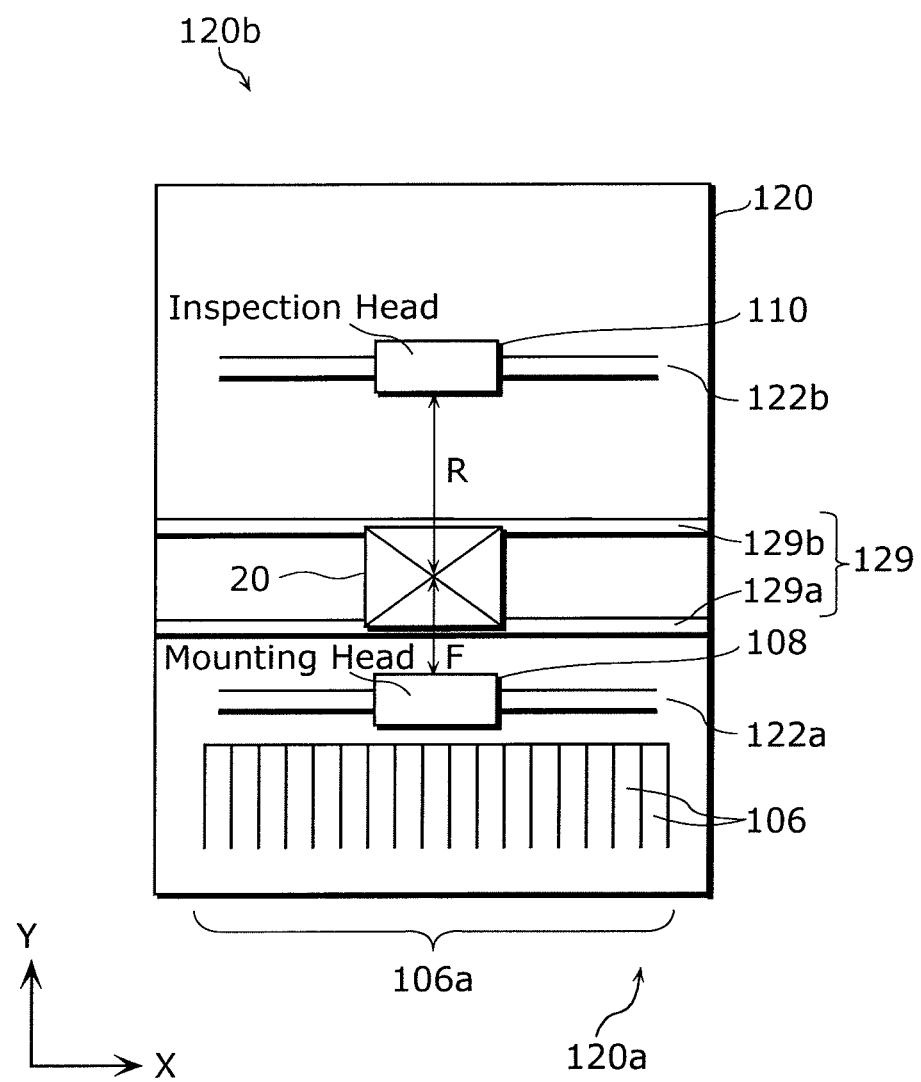
FIG. 14 is a plan view of a main structure in the component mounter.

FIG. 14 is a plan view of a main structure in the component mounter 120.

The component mounter 120 includes a front stage 120a and a rear stage 120b which are arranged in a front-back direction of the component mounter 120 (Y-axis direction) that is a direction perpendicular to a direction of transporting a substrate 20 (X-axis direction).

The front stage 120a is a device for mounting components on the substrate 20 and thereby manufacturing a circuit board. The front stage 120a includes the component supplying unit 106a, a beam 122a, and the mounting head 108. The component supplying unit 106a is provided with a plurality of feeders 106 each storing a component tape. The beam 122a will be explained later. The mounting head 108 has a plurality of pickup nozzles (hereinafter, referred to also simply as "nozzles") each of which is capable of picking up an electronic component from the feeder 106 and mounting the component on the substrate 20.

The rear stage 120b is a device for inspecting a status of a surface (surface status) of the substrate 20. The rear stage 120b has the inspection head 110 and a beam 122b. The inspection head 110 inspects the surface status of the substrate 20.

Here, the "component tape" refers to a tape (a carrier tape) in which a number of the same type of components have been arranged, with such tape being supplied from a reel (a supply reel) or the like around which the tape has been wound. The component tape is mainly used to supply relatively small components, which are known as chip components, to the component mounter.

This front stage 120a is actually a mounting device that includes the functions of both a component mounter called a high-speed mounter and a component mounter called a multi-function mounter. A high-speed mounter is a device with high productivity of mounting electronic components that are 10 mm$^2$ or smaller in around 0.1 seconds, while a multi-function mounter is a device that can mount large electronic components that are 10 mm$^2$ or larger, irregularly shaped components like switches and connectors, and IC components like Quad Flat Package (QFP) or Ball Grid Array (BGA) components.

In other words, this front stage 120a is designed to mount almost any types of electronic components (ranging from chip resistors of 0.4 mm×0.2 mm to connectors of 200 mm). The necessary number of such component mounters 120 form a mounting a line.

The beam 122a is a rigid body extending along an X-axis direction, and is capable of moving along a pathway (not shown) in a Y-axis direction (perpendicular to a direction of transporting a substrate 20) while keeping in parallel to the X-axis direction. Furthermore, the beam 122a is provided with the mounting head 108, and can move the mounting head 108 along the beam 122a, namely, in the X-axis direction. The beam 122a can move the mounting head 108 to anywhere on a X-Y plane, by (i) moving in the Y-axis direction and (ii) causing the mounting head 108, which also travels in the Y-axis direction with the move of the beam 122a, to move to the X-axis direction. Furthermore, motors (not shown) are provided to the beam 122a to move the beam 122a and the mounting head 108, being supplied with power via the beam 122a.

The beam 122b has the same structure as that of the beam 122a. When the beam 122b moves in the Y-axis direction and causes the inspection head 110 on the beam 122b to move in the X-axis direction, the inspection head 110 can move to anywhere on the X-Y plane, in the same manner as described for the mounting head 108.

Moreover, in the component mounter 120, there is provided a rail pair 129 between the front stage 120a and the rear stage 120b. Substrates 20 are transported along the rail pair 129.

The rail pair 129 consists of a fixed rail 129a and a movable rail 129b. The fixed rail 129a is fixed at a predetermined position. The movable rail 129b can move in the Y-axis direction depending on a length in the Y-axis direction of each transported substrate 20.

Figure 15:
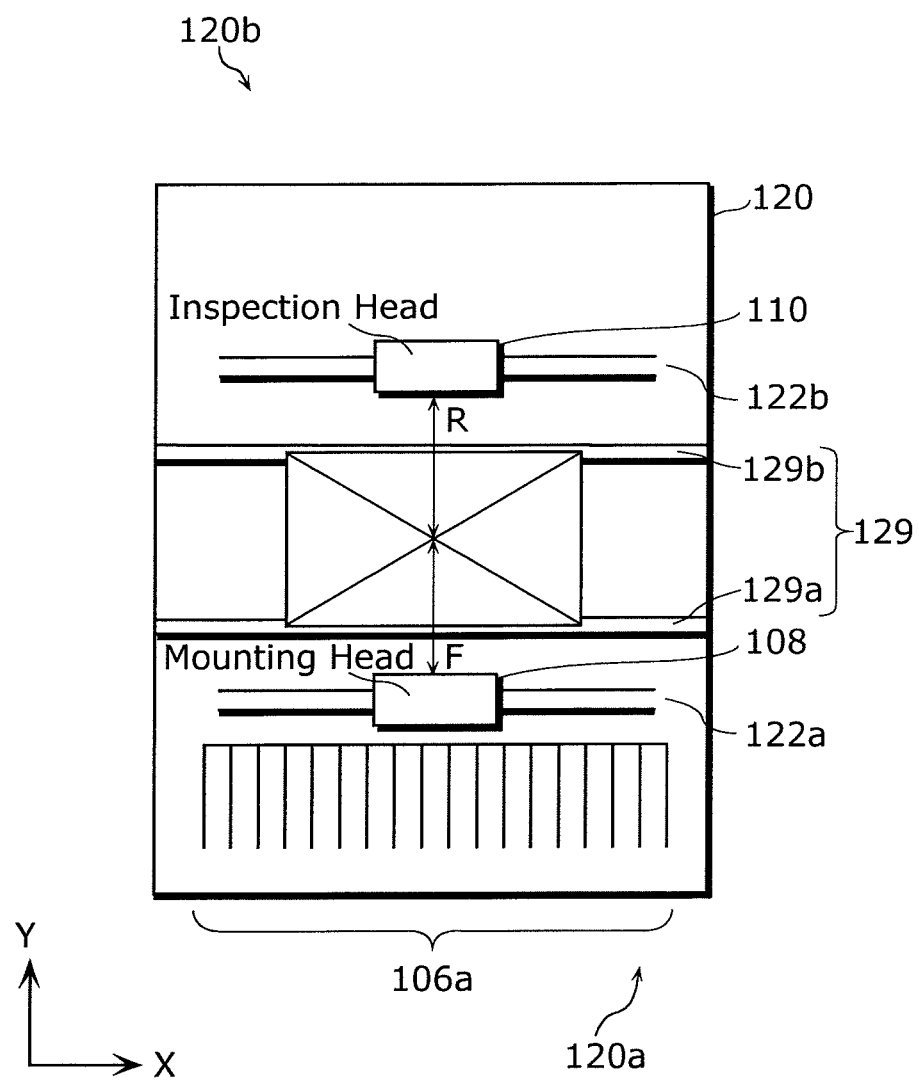
FIG. 15 is a plan view of a main structure in the component mounter.

Assuming that a distance from a home position of the mounting head 108 to the center of a substrate 20 is "F", and that a distance from a home position of the inspection head 110 to the center of the substrate 20 is "R", there is a relationship of F≦R. In other words, as shown in FIG. 15, F=R when the movable rail 129b is shifted to a position which maximizes a distance between the fixed rail 129a and the movable rail 129b, and as shown in FIG. 14, F<R when the movable rail 129b is located at any other positions. Here, the home position of the mounting head 108 is not above the substrate 20. For instance, as shown in FIG. 14, the home position of the mounting head 108 is close to the center of the component supplying unit 106a in the X-axis direction. In addition, the home position of the inspection head 110 is not above the substrate 20. For instance, as shown in FIG. 14, the home position of the inspection head 110 is between an end of the component mounter 120 in the Y-axis direction and the substrate 20, and is close to the center of the component mounter 120 in the X-axis direction.

An operation time period required for the mounting head 108 to mount components on a substrate 20 is longer than an operation time period required for the inspection head 110 to inspect the substrate 20. This is because the inspection head 110 can inspect a plurality of mounting points on the substrate 20 at once. Therefore, the mounting head 108 is arranged at the front stage 120a and the inspection head 110 is arranged at the rear stage 120b so that a travel time period of the mounting head 108 to move from the home position of the mounting head 108 to the substrate 20 is shorter than a travel time period of the inspection head 110 to move from the home position of the inspection head 110 to the substrate 20. The arrangement can minimize a difference between (a) the operation time period of the mounting head 108 including the travel time period for reaching the substrate 20 and (b) the operation time period of the inspection head 110 including the travel time period for reaching the substrate 20. It is preferable that the arrangement can substantially equalize the operation time periods.

It should be noted that the front stage 120a includes: a component recognition camera that two-dimensionally and three-dimensionally inspects a status of components picked up by the mounting head 108 (a pick-up status); a tray supplying unit that supplies tray components; and the like, but these elements are not main characteristics of the present invention. Therefore, the elements are not shown in FIGS. 14 and 15.

In the second embodiment, it has been described that the mounting head 108 is provided at the front side (the front stage 120a) and the inspection head 110 is provided to the rear side (the rear stage 120b). However, the component mounter of the present invention is not limited to the above. For example, the component mounter may have the mounting head 108 on the upstream and the inspection head 110 on the downstream in a direction of transporting substrates. In other words, the present invention does not depend on how to arrange the mounting head 108 and the inspection head 110, as far as the component mounter is provided with the mounting head 108 and the inspection head 110 having different distances from the corresponding home position to a substrate 20.

The mounting head 108 has the same structure as described in the first embodiment with reference to FIG. 3. The inspection head 110 has the same structure as described in the first embodiment with reference to FIGS. 4 and 5.

The component mounter 120 has the same structure as that of the component mounter 100 shown in FIG. 6.

The mounting data 134a is the same as described in the first embodiment with reference to FIG. 7, and the inspection conditions 134b is the same as described in the first embodiment with reference to FIG. 8.

Figure 16:
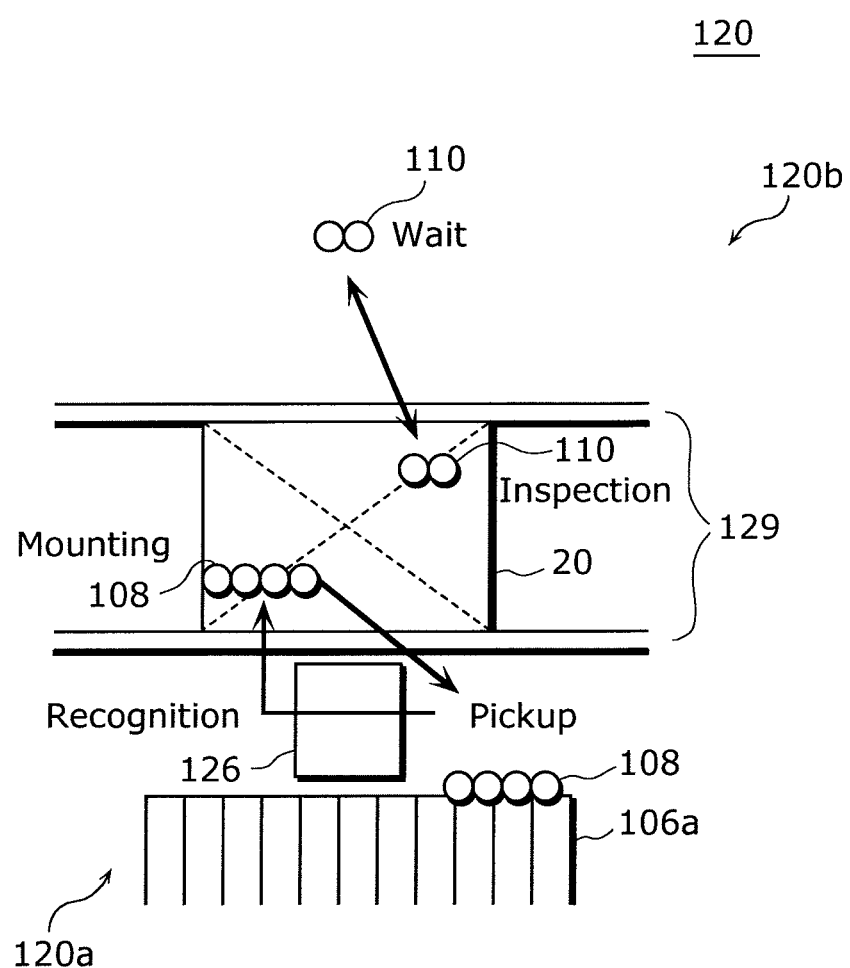
FIG. 16 is a diagram for explaining cooperation between the mounting head and the inspection head.

FIG. 16 is a diagram for explaining cooperation between the mounting head 108 and the inspection head 110.

As shown in FIG. 16, the mounting head 108 at the front stage 120a repeats a set of three operations that are: "picking up" components from the component supplying unit 106a; "recognizing" the pick-up components by the component recognition camera 126; and "mounting" the recognized components to a substrate 20. Thereby, the components can be mounted on substrates 20.

On the other hand, the inspection head 110 of the rear stage 120b repeats a set of two operations that are: "inspecting" a status of a surface of a substrate 20 or a status of components mounted on a substrate 20; and "waiting" at the home position of the inspection head 110. Thereby, substrates 20 can be inspected.

Here, if the mounting head 108 and the inspection head 110 operate independently, there is a possibility that the mounting head 108 and the inspection head 110 hit each other. More specifically, when the inspection head 110 performs the "inspecting" operation while the mounting head 108 performs the "mounting" operation, the two heads go to a substrate at the same time. Therefore, there is a possibility that the two heads hit each other. In order to avoid such a hit of the heads, the mounting head 108 and the inspection head 110 cooperate to perform the component mounting and the substrate inspection efficiently.

Figure 17:
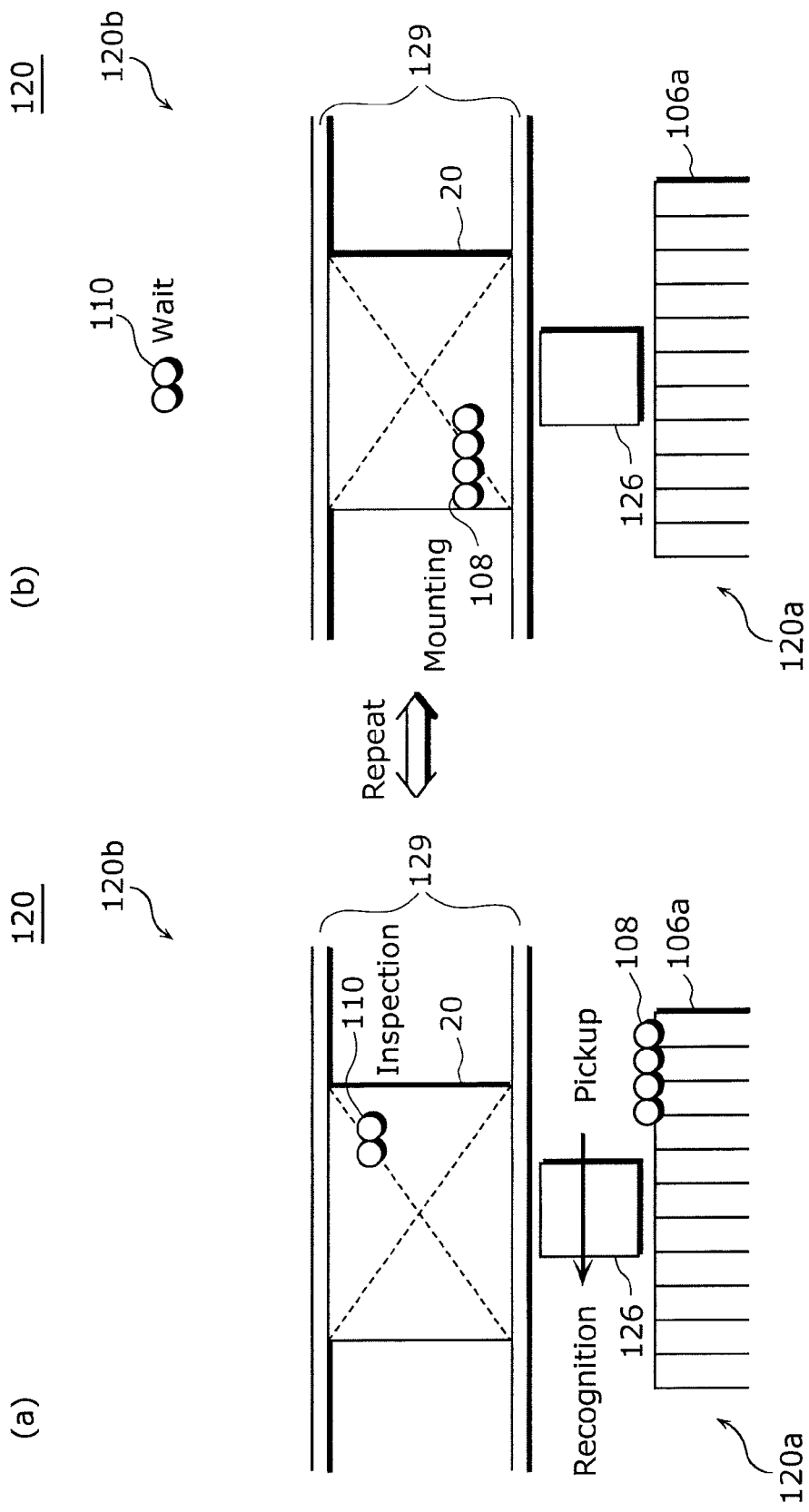
FIG. 17 is another diagram for explaining cooperation between the mounting head and the inspection head.

In more detail, as shown in (a) of FIG. 17, while the inspection head 110 at the rear stage 120*b* performs the "inspecting" operation, the mounting head 108 at the front stage 120*a* performs the "picking up" operation and the "recognizing" operation. On the other hand, as shown in (b) of FIG. 17, while the mounting head 108 at the front stage 120*a* performs the "mounting" operation, the inspection head 110 at the rear stage 120*b* "waits" at the home position of the inspection head 110. As described above, if the "inspecting" operation of the inspection head 110 and the "mounting" operation of the mounting head 108 perform alternately, it is possible to prevent a hit between the mounting head 108 and the inspection head 110. It is preferable that, if the "picking up" and "recognizing" operations of the mounting head 108 end during the "inspecting" operation of the inspection head 110, the mounting head 108 can immediately start the "mounting" operation when the "inspecting" operation of the inspection head 110 ends. As a result, it is possible to improve efficiency in manufacturing circuit boards (component-mounted substrates). Here, the inspection head 110 does not perform any operation during "waiting". Therefore, when the "mounting" operation of the mounting head 108 ends, the inspection head 110 can immediately start the "inspecting" operation.

Next, an example of a flow of the component mounting and the substrate inspection of the component mounter 120 is described with reference to FIGS. 14, 18A, 18B, 19A, and 19B. It is assumed in the flow that the mounting head 108 mounts fine components on a substrate 20 in the first task and then mounts large components such as CSPs in the following tasks.

Figure 18A:
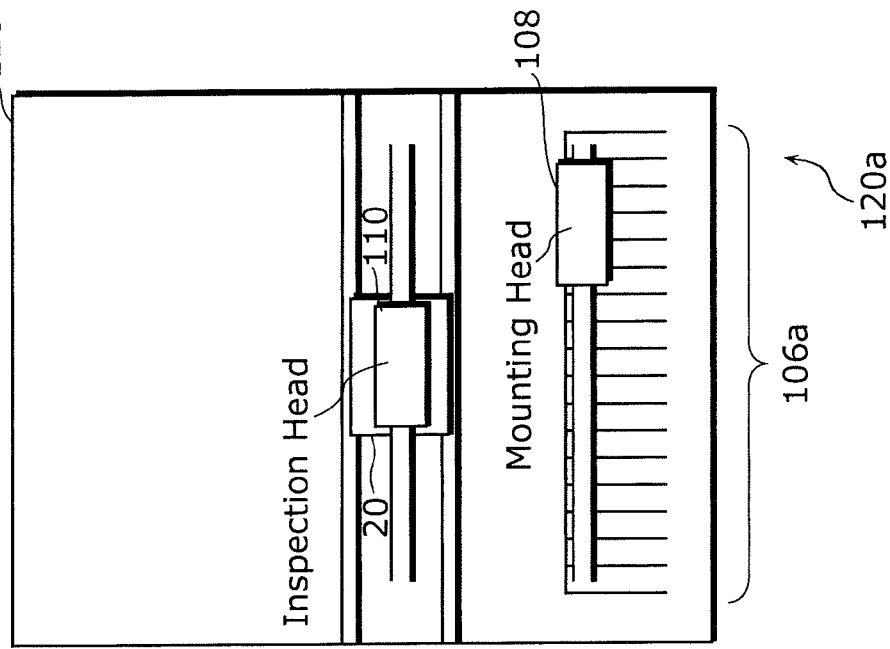
FIGS. 18A and 18B are diagrams showing an example of a flow of component mounting and substrate inspection performed by the component mounter.

When the component mounting and the substrate inspection start, the mounting head 108 and the inspection head 110 are located at respective home positions as shown in FIG. 14. Then, as shown in FIG. 18A, the mounting head 108 performs "picking up", "recognizing", and "mounting" operations for the fine components so as to mount them on the substrate 20. During these operations, the inspection head 110 "waits" at the home position of the inspection head 110.

Figure 18B:
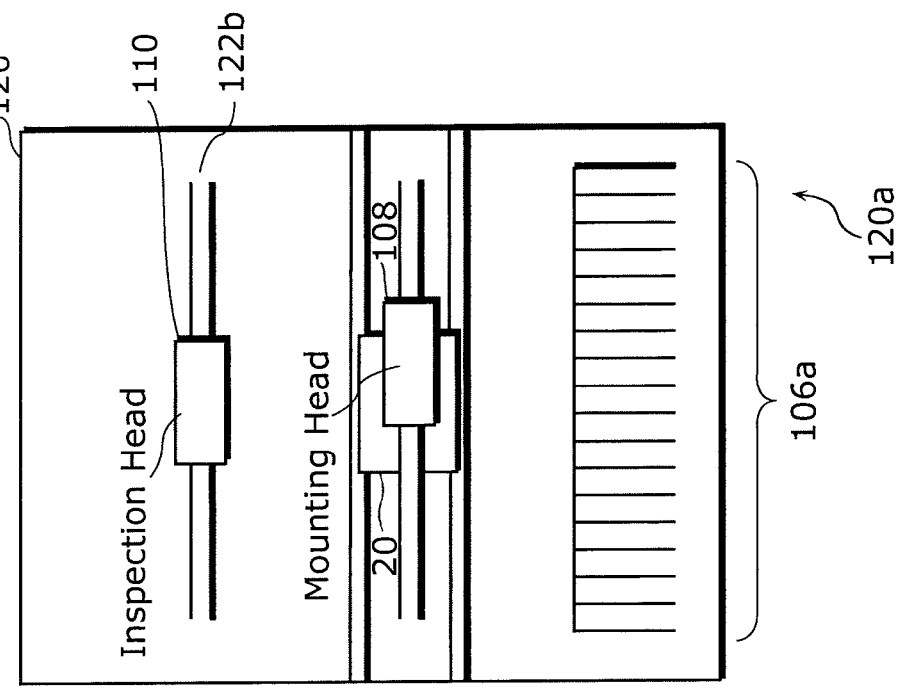

When the "mounting" operation of the mounting head 108 ends, as shown in FIG. 18B, the inspection head 110 goes to above the substrate 20 and the mounting head 108 leaves the substrate 20. After going to above the substrate 20, the inspection head 110 performs the "inspecting" operation which includes post-mounting inspection and pre-mounting inspection. More specifically, the inspection head 110 firstly inspects a mounting status of the fine components mounted by the mounting head 108. Secondly, the inspection head 110 inspects a status of a surface of the substrate 20 to check mounting positions at which next components are to be mounted by the mounting head 108. For example, the inspection head 110 inspects whether or not any component falls on the surface of the substrate 20 and whether or not printing of solder paste on the substrate 20 is defective. While the inspection head 110 performs the "inspecting" operation, the mounting head 108 "picks up" components from the component supplying unit 106*a* for a next task and "recognizes" the pick-up components. When the mounting head 108 ends the "recognizing" operation, the inspection head 110 waits at the home position outside the substrate 20.

Figure 19A:
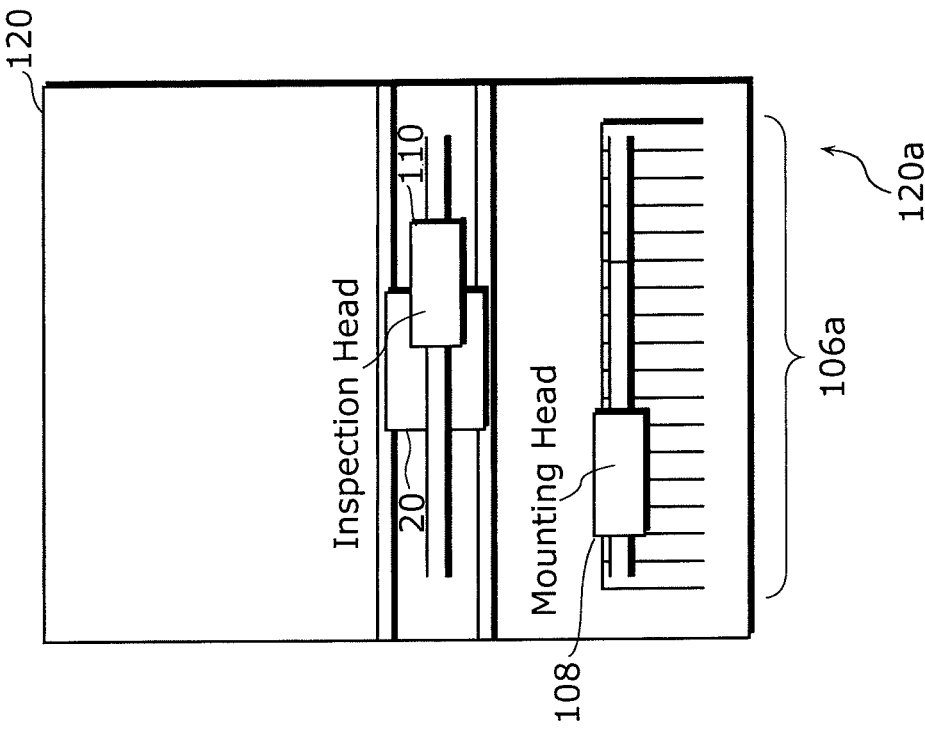
FIGS. 19A and 19B are further diagrams showing the example of the flow of component mounting and substrate inspection performed by the component mounter.

When the "inspecting" operation of the inspection head 110 ends, as shown in FIG. 19A, the inspection head 110 starts "waiting" at the home position. When the inspection head 110 starts "waiting" at the home position, the mounting head 108 goes to above the substrate 20 to perform the "mounting" operation.

Figure 19B:
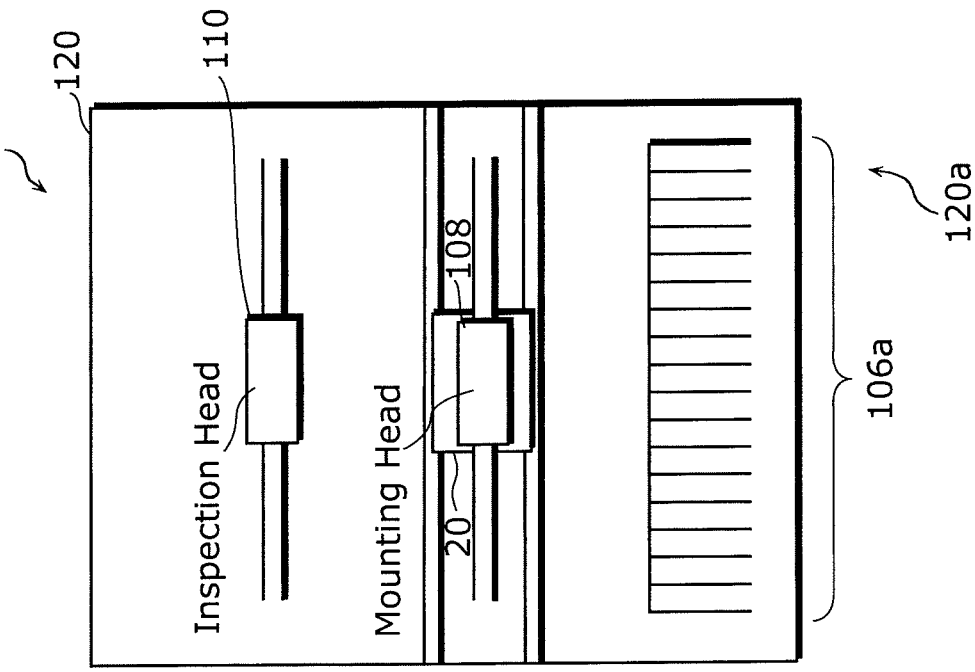

When the "mounting" operation of the mounting head 108 ends, as shown in FIG. 19B, the inspection head 110 goes to above the substrate 20 and the mounting head 108 leaves the substrate 20. Likewise FIG. 18B, the inspection head 110 performs the "inspection" operation and the mounting head 108 performs the "picking up" and "recognizing" operations.

Subsequently, the situation shown in FIG. 19A and the situation shown in FIG. 19B are repeated until all tasks have been completed. In other words, the component mounting of the mounting head 108 and the substrate inspection of the inspection head 110 are repeated alternately until all tasks have been completed.

As described above, in the second embodiment, the mounting head 108 is arranged at the side having a shorter distance from the corresponding home position to the substrate 20 (namely, arranged at the front stage 120*a*), and the inspection head 110 is arranged at the side having a longer distance from the corresponding home position to the substrate 20 (namely, arranged at the rear stage 120*b*). Thereby, a travel time period of the mounting head 108 to reach a substrate is shorter than a travel time period of the inspection head 110. On the other hand, as described previously, the operation time period required for the mounting head 108 to mount components on a substrate 20 is longer than the operation time period required for the inspection head 110 to inspect the substrate 20. Therefore, the arrangement can minimize a difference between (a) the operation time period of the mounting head 108 including the travel time period for reaching the substrate 20 and (b) the operation time period of the inspection head 110 including the travel time period for reaching the substrate 20. It is preferable that the arrangement can substantially equalize the operation time periods. Moreover, the mounting head 108 and the inspection head 110 cooperate to perform the component mounting and the substrate inspection efficiently. Thereby, it is possible to minimize a waste time in which the mounting head 108 and the inspection head 110 are idle. As a result, a takt time required for the component mounter 120 to manufacture a circuit board (component-mounted substrate) can be shortened.

It should be noted that the arrangement of the mounting head 108 and the inspection head 110 can be determined, not depending on a difference between distances from the respective home positions to the substrate 20, but depending on a difference between travel time periods per unit distance. In general, the inspection head 110 needs to be arranged more accurately than the mounting head 108. Therefore, a maximum acceleration of the inspection head 110 is less and the travel time period of the inspection head 110 is longer. However, there are various kinds of the mounting heads 108 having different number of nozzles. The various mounting heads 108 have different travel time periods. For example, if there are a mounting head 108 having 12 pick-up nozzles, a mounting head 108 having 8 pick-up nozzles, and a mounting head 108 having 3 pick-up nozzles, a mounting head having less pick-up nozzles has a less maximum acceleration and a longer travel time period because such a mounting head needs to transport larger components. Therefore, a travel time period per unit distance is longer in an order of the mounting head 108 having 12 pick-up nozzles, the mounting head 108 having 8 pick-up nozzles, the inspection head 110, and the mounting head 108 having 3 pick-up nozzles. Therefore, if two heads among the above-described four heads are to be arranged in the component mounter 120, a head having a longer travel time period per unit distance is arranged at the front stage 120a, and a head having a shorter travel time period per unit distance is arranged at the rear stage 120b.

Third Embodiment

It has been described in the first and second embodiments that the arrangement of the mounting head 108 and the inspection head 110 are predetermined. In the third embodiment, however, a head arrangement determination device determines where to arrange the mounting head 108 and the inspection head 110.

Figure 20:
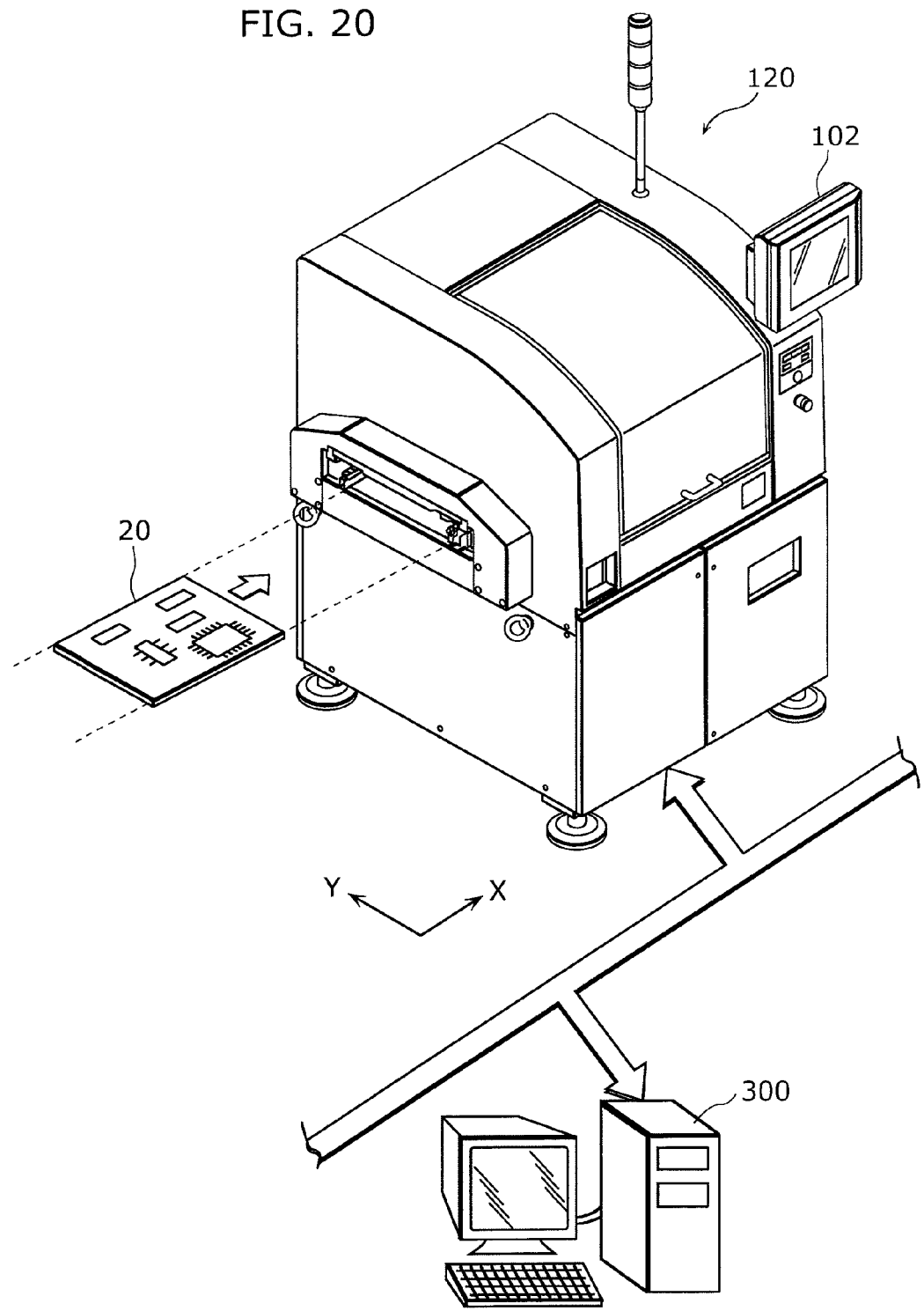
FIG. 20 is an external perspective view of a structure of a component mounting system including a head arrangement determination device.

FIG. 20 is an external perspective view of a structure of a component mounting system including a head arrangement determination device.

The component mounting system includes: the component mounter 120 which is the same as the component mounter 120 according to the second embodiment; and a head arrangement determination device 300.

Figure 21:
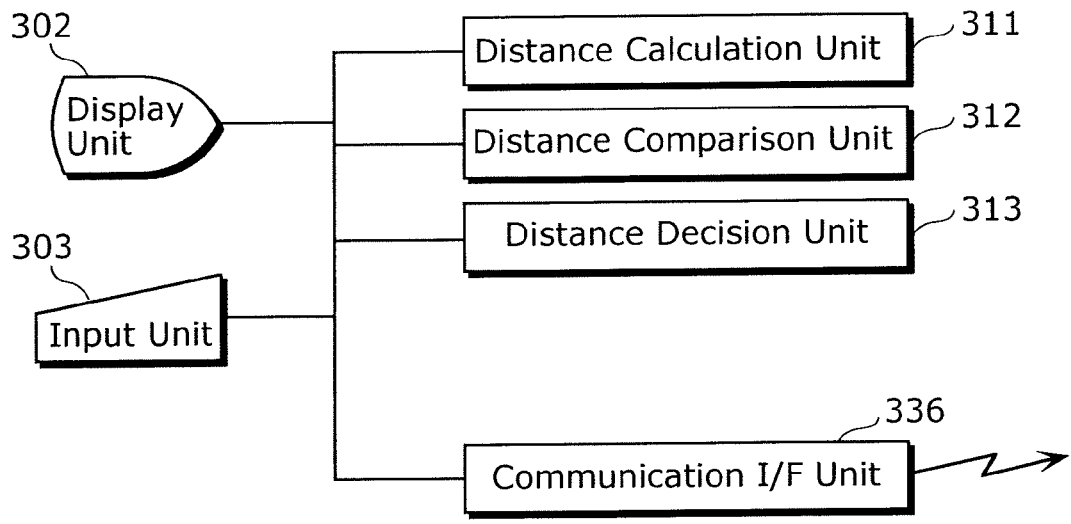
FIG. 21 is a block diagram showing a functional structure of the head arrangement determination device.

FIG. 21 is a block diagram showing a functional structure of the head arrangement determination device 300.

The head arrangement determination device 300 is connected to the component mounter 120 via a network. The head arrangement determination device 300 is a device that determines an arrangement of the mounting head and the inspection head in the component mounter 120. The head arrangement determination device 300 includes: a distance calculation unit 311, a distance comparison unit 312, an arrangement determination unit 313, a display unit 302, an input unit 303, and a communication I/F unit 336.

The head arrangement determination device 300 is implemented by executing a program according to an aspect of the present invention by a general-purpose computer system such as a personal computer. Here, the functional units of the head arrangement determination device 300 may be included in the component mounter 120.

Each of the distance calculation unit 311, the distance comparison unit 312, and the arrangement determination unit 313 is a processing unit functionally implemented by executing the program in a Central Processing Unit (CPU).

The distance calculation unit 311 is a processing unit that calculates a distance from a first home position on the front stage 120a of the component mounter 120 to a substrate 20, and calculate a distance from a second home position on the rear stage 120b of the component mounter 120 to the substrate 20.

The distance comparison unit 312 is a processing unit that compares the distances calculated by the distance calculation unit 311 to each other.

The arrangement determination unit 313 is a processing unit that determines at which stage the mounting head 108 is to be arranged and at which stage the inspection head 110 is to be arranged, based on the result of the comparison performed by the distance comparison unit 312.

The display unit 302 is a Cathode-Ray Tube (CRT), a Liquid Crystal Display (LCD), or the like. The input unit 303 is a keyboard, a mouse, and the like. The display unit 302 and the input unit 303 are used in communication between the head arrangement determination device 300 and an operator, for example.

The communication interface (I/F) unit 336 is an interface for communicating with the component mounter 120 and the like. An example of the communication I/F unit 336 is a Local Area Network (LAN) adaptor.

Figure 22:
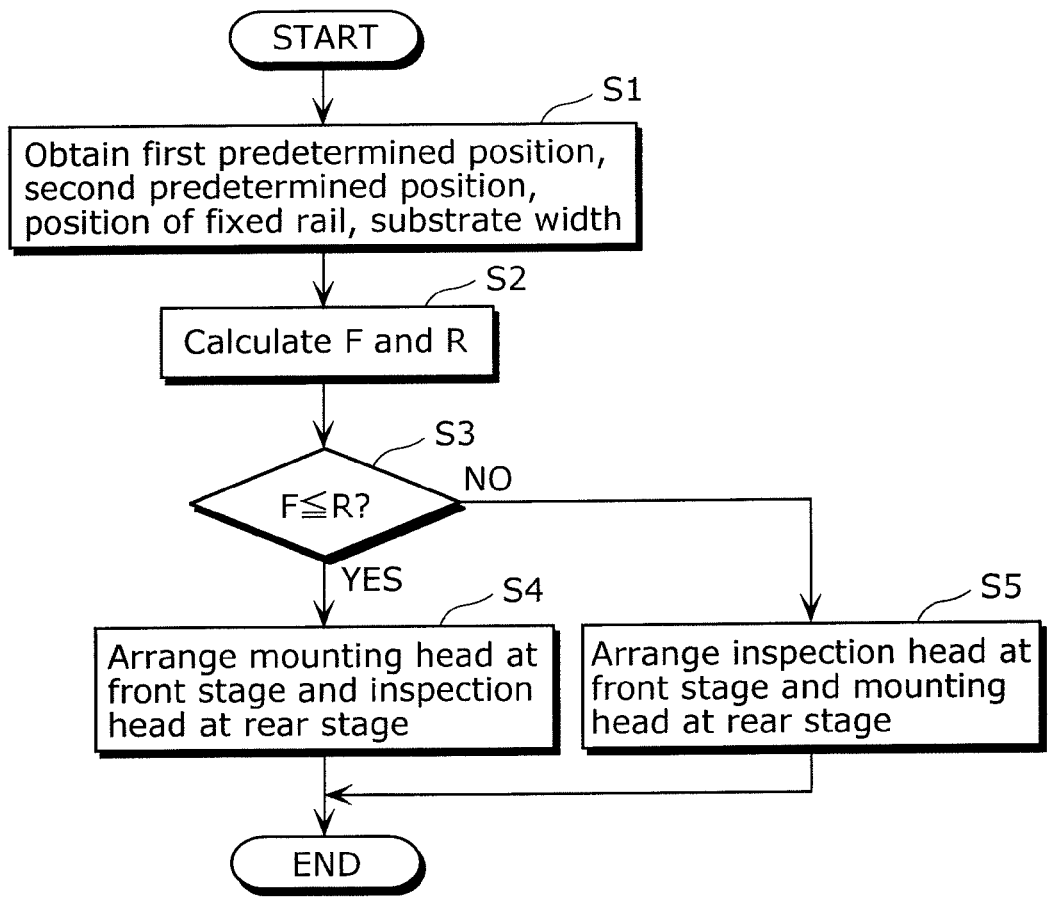
FIG. 22 is a flowchart of processing for determining an arrangement of heads.

FIG. 22 is a flowchart of processing for determining an arrangement of the heads.

From the component mounter 120 via the communication I/F unit 336, the distance calculation unit 311 in the head arrangement determination device 300 obtains y coordinates of the first home position, y coordinates of the second home position, y coordinates of the fixed rail, and a substrate width (S1). It should be noted that a part or all of these pieces of data may be previously stored in the head arrangement determination device 300.

Figure 23:
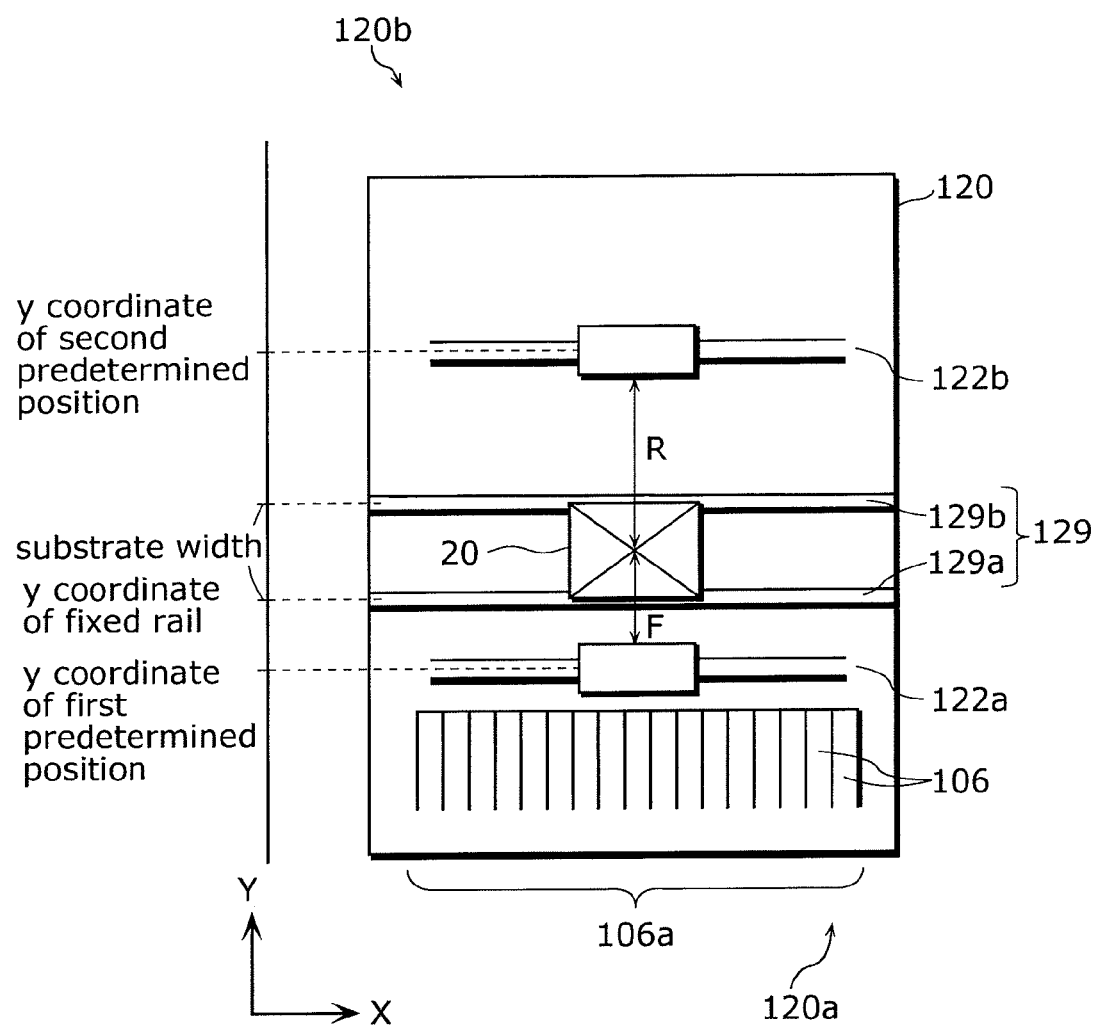
FIG. 23 is a diagram for explaining data necessary to calculate a distance between a home position and a substrate.

FIG. 23 is a diagram for explaining these pieces of data. The y coordinates of the first home position is y coordinates of a home position of the beam 122a provided at the front stage 120a of the component mounter 120. The y coordinates of the second home position is y coordinates of a home position of the beam 122b provided at the rear stage 120b of the component mounter 120. The substrate width is data indicating a width of a substrate 20 in the Y-axis direction.

Based on the y coordinates of the first home position, the y coordinates of the second home position, the y coordinates of the fixed rail, and the substrate width, the distance calculation unit 311 calculates a distance F from the first home position to the substrate 20 and a distance R from the second home position to the substrate 20 according to the following equations (S2).

$$F = y \text{ coordinates of fixed rail} - y \text{ coordinates of first home position} + (\text{substrate width}/2)$$

$$R = y \text{ coordinates of second home position} - y \text{ coordinates of fixed rail} - (\text{substrate width}/2)$$

The distance comparison unit 312 compares the distance F to the distance R (S3).

As a result of the comparison, if $F \leq R$ (Yes at S3), then the arrangement determination unit 313 determines that the mounting head 108 is to be arranged at the front stage 120a and the inspection head 110 is to be arranged at the rear stage 120b (S4). On the other hand, if F>R (No at S3), then the arrangement determination unit 313 determines that the inspection head 110 is to be arranged at the front stage 120a and the mounting head 108 is to be arranged at the rear stage 120b (S5). By making such determinations, it is possible to arrange the inspection head 110 at a stage having a longer distance from the home position to the substrate 20 and arrange the mounting head 108 at a stage having a shorter distance. The arrangement can minimize a difference between (a) the operation time period of the mounting head 108 and (b) the operation time period of the inspection head 110. It is preferable that the arrangement can substantially equalize the operation time periods. As a result, a takt time required for the component mounter 120 to manufacture a circuit board (component-mounted substrate) can be shortened.

Here, if F=R, the arrangement determination unit 313 determines that the mounting head 108 is to be arranged at the front stage 120a. This is because this arrangement of the mounting head 108 results in the component supplying unit 106a arranged also at the front stage 120a, and thereby the operator can easily supply new components when components are running out.

It should be noted that it has been described in the third embodiment that the distance calculation unit 311 calculates the distances to the substrate 20, but the data of the distances can be obtained from the component mounter 120.

Fourth Embodiment

It has been described in the first to third embodiments that the component mounter includes the mounting head and the inspection head. However, instead of the inspection head, the component mounter according to the fourth embodiment includes an application head that applies adhesive on substrates.

Figure 24:
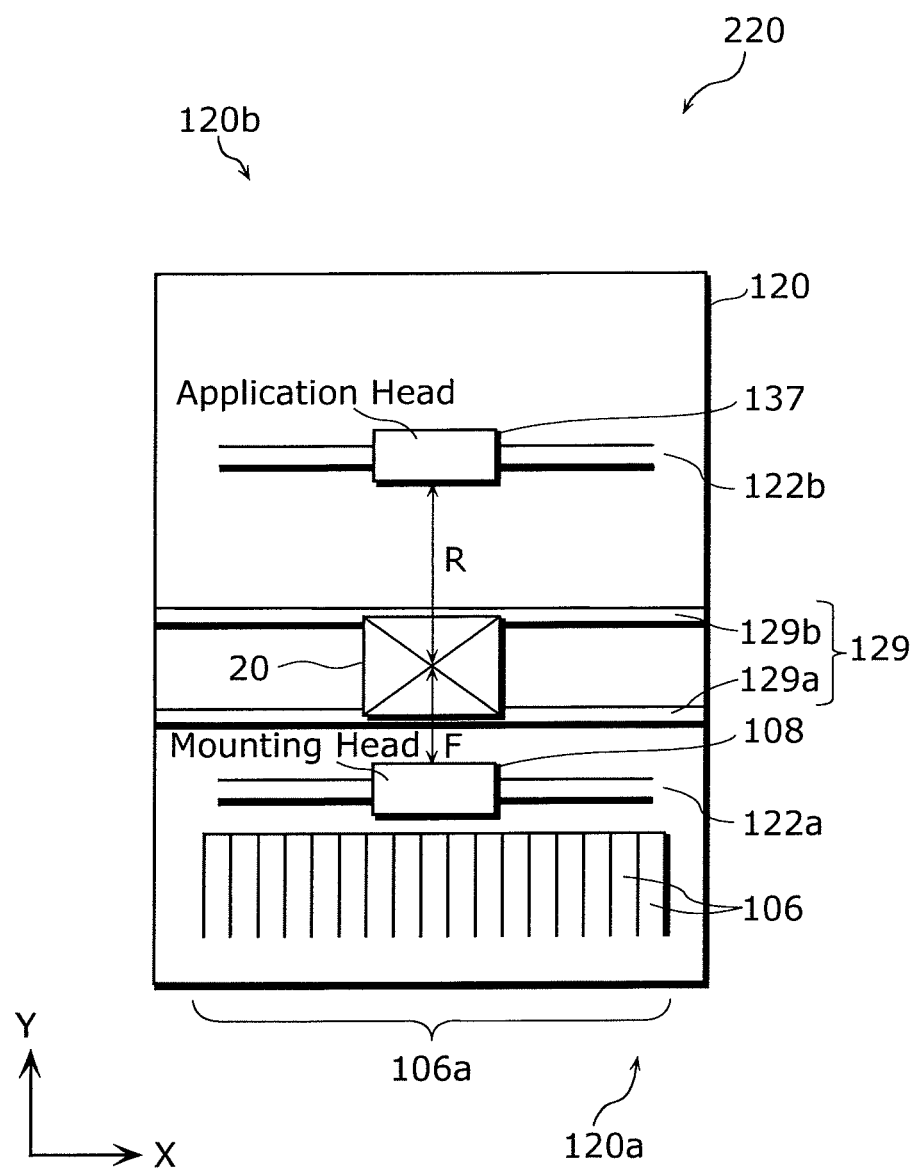
FIG. 24 is a diagram showing a main structure of the component mounter including an application head.

FIG. 24 is a diagram showing a main structure of the component mounter including the application head.

The component mounter 220 differs from the component mounter 120 shown in FIG. 14 in that the inspection head 110 is replaced by the application head 137. As shown in FIG. 24, the mounting head 108 is arranged at the front stage 120a, and the application head 137 is arranged at the rear stage 120b.

Figure 25:
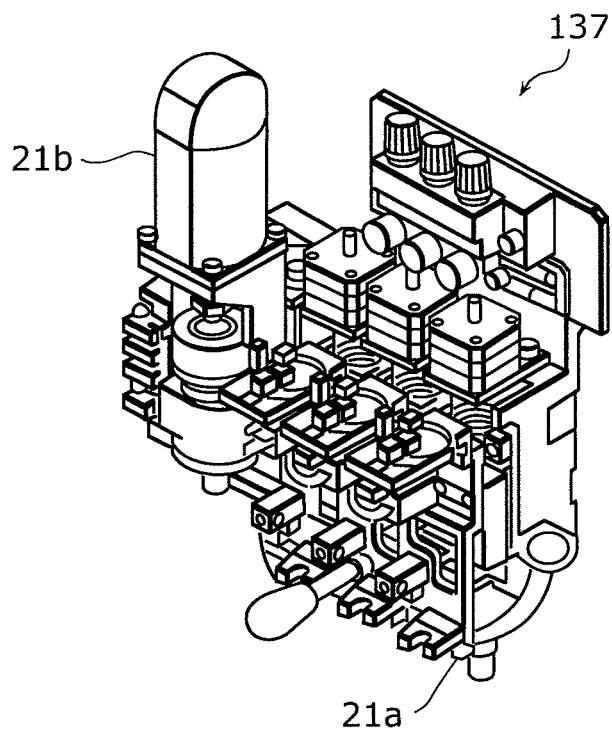
FIG. 25 is an external perspective view of an application head provided to an adhesive applicator to apply adhesive on substrates.

FIG. 25 is an external perspective view of the application head provided to an adhesive applicator 21 to apply adhesive on substrates.

The application head 137 includes a tank 21b in which adhesive is stored and a discharge unit 21a which discharges the adhesive onto substrates 20.

Figure 26:
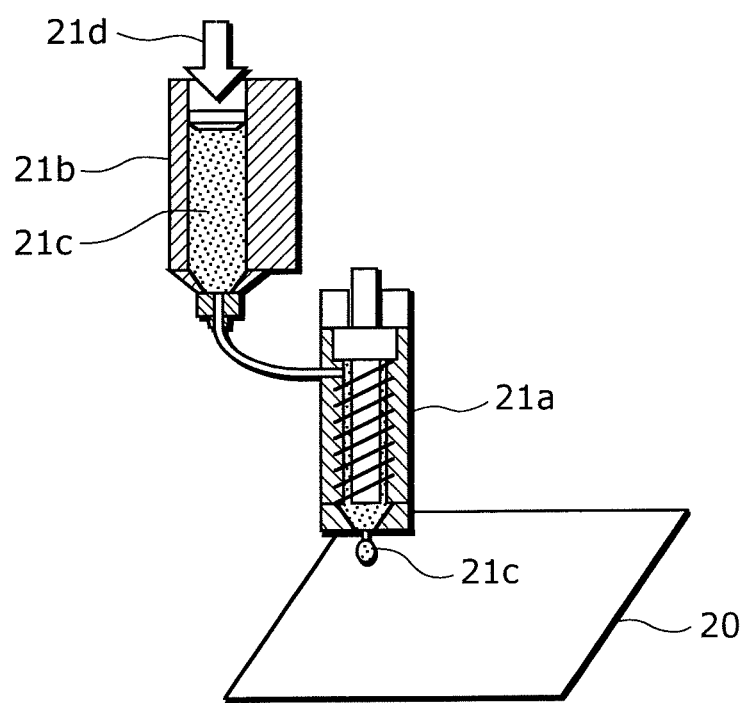
FIG. 26 is a diagram for explaining how to apply adhesive.

FIG. 26 is a diagram for explaining application of adhesive.

The adhesive 21c stored in the tank 21b is injected to the discharge unit 21a by air 21d, and squeezed out from an end of the discharge unit 21a. The squeezed adhesive is applied on a substrate 20.

The application head 137 discharges adhesive on mounting points of components, and then the mounting head 108 mounts the components on the mounting points applied with the adhesive. Thereby, the components can be surely fixed on the substrate 20.

The mounting head 108 and the application head 137 cooperate to alternately perform the adhesive application of the application head 137 and the component mounting of the mounting head 108, likewise the cooperation of the mounting head 108 and the inspection head 110.

The adhesive application of the application head 137 can be completed faster than the component mounting of the mounting head 108, likewise the situation of the substrate inspection of the inspection head 110 and the component mounting of the mounting head 108. Therefore, as shown in FIG. 24, the mounting head 108 is arranged at the side having a shorter distance from a home position of the mounting head 108 to a target substrate 20, and the application head 137 is arranged at the side having a longer distance from a home position of the application head 137 to the substrate 20. The arrangement can minimize a difference between (a) an operation time period of the mounting head 108 including a travel time period for reaching the substrate 20 and (b) an operation time period of the inspection head 110 including a travel time period for reaching the substrate 20. It is preferable that the arrangement can substantially equalize the operation time periods. Thereby, it is possible to minimize a waste time in which the mounting head 108 and the application head 137 are idle. As a result, a takt time required for the component mounter 220 to manufacture a circuit board (component-mounted substrate) can be shortened. If the operation time period of the application head 137 is longer than the operation time period of the mounting head 108, it is also possible that the application head 137 is arranged at the front stage 120a and the mounting head 108 is arranged at the rear stage 120b.

It should be noted that the arrangement of the mounting head 108 and the application head 137 can be determined, not depending on a difference between distances from the respective home positions to a target substrate 20, but depending on a difference between travel time periods per unit distance. A relationship between the number of pick-up nozzles and a travel time period of the mounting head 108 is the same as described in the second embodiment. Furthermore, it can be considered that a travel time period of the application head 137 is subsequently equal to a travel time period of a mounting head 108 having 12 pick-up nozzles. Therefore, a travel time period per unit distance is longer in an order of the application head 137 (=a mounting head 108 having 12 pick-up nozzles), a mounting head 108 having 8 pick-up nozzles, and a mounting head 108 having 3 pick-up nozzles. In other words, the travel time period of the application head 137 is equal to or longer than the travel time period of any mounting head 108. Therefore, it is also possible that the application head 137 is arranged at the front stage 120a, and the mounting head 108 is arranged at the rear stage 120b.

Thus, although the component mounters according to the embodiments of the present invention have been described, the present invention is not limited to the above embodiments.

For example, a position where components are supplied from the component supplying unit 106a may be set to be the home position of the mounting head 108. This is because the mounting head 108 moves to the above position to pick up components for a next task and then moves from the position in the component supplying unit 106a to a target substrate 20, but does not wait, like the inspection head 110 and the application head 137, at the home position described in the above embodiments when the mounting head 108 does not perform any operation for the substrate 20.

It is also possible that a waiting position of the mounting head 108 after the component recognition camera recognizes components is set to be the home position of the mounting head 108. This is because the mounting head 108 moves from the waiting position to a target substrate 20 after the other head (the inspection head 110 or the application head 137) completes operation for the substrate 20.

Furthermore, although it has been described with reference to FIGS. 18 and 19 that the mounting head 108 performs the component mounting prior to the substrate inspection of the inspection head 110, it is also possible that the inspection head 110 performs the substrate inspection prior to the component mounting of the mounting head 108.

The prevent invention can be realized also as a mounting condition determination device that determines mounting conditions for the mounting method described in the embodiments. The mounting condition determination device can be implemented by executing a program by a general computer having a CPU, a memory, and the like.

The embodiments described herein are mere exemplary embodiments of the present invention and do not limit the present invention. The scope of the present invention is not in the above description but in the claims. Many modifications are possible within the meanings and the scope of the claims.

INDUSTRIAL APPLICABILITY

The present invention can be applied to component mounters that manufacture circuit boards (component-mounted substrates), and especially to a component mounter that performs processing for substrates alternately using (i) a mounting head and (ii) an inspection head or an adhesive application head.

The invention claimed is:

1. A component mounter that mounts a component on a substrate, said component mounter comprising:
a mounting unit configured to mount a predetermined component on a substrate, the mounting unit being configured to repeat the mounting;
a determination unit configured to determine whether the predetermined component is a first predetermined component or a second predetermined component, the first predetermined component requiring a high accuracy in the mounting and including a fine component and a component with a narrow lead pitch, and the second predetermined component requiring, before mounting the second predetermined component, confirmation of a status of a region in which the second predetermined component is to be mounted on the substrate; and an inspection unit configured to, (i) when said determination unit determines that the redetermined component is the first predetermined component, inspect a mounting status of the first predetermined component after mounting the first predetermined component, and (ii) when said determination unit determines that the predetermined component is the second predetermined component, inspect the status of the region in which the second predetermined component is to be mounted on the substrate, before mounting the second predetermined component to determine whether the region is acceptable for mounting the second predetermined component, wherein said mounting unit is a mounting head configured to mount the component on the substrate, said inspection unit is an inspection head configured to inspect the substrate, said mounting head and said inspection head are configured and arranged to alternately move above the substrate to perform mounting or inspecting, an operation time period required for said mounting head to mount the component on the substrate being longer than an operation time period required for said inspection head to inspect the substrate above the substrate, and a home position of said mounting head and a home position of said inspection head are set to satisfy a relationship that a distance from the home position of said mounting head to the substrate is equal to or longer than a distance from the home position of said inspection head to the substrate.

2. A mounting condition determination method of determining a mounting condition for mounting a component on a substrate, said mounting condition determination method comprising:

determining a first mounting condition for mounting a component on a substrate that is predetermined, the mounting being repeated;

determining a second mounting condition for determining whether the component is a first predetermined component or a second predetermined component, the first predetermined component requiring a high accuracy in the mounting and including a fine component and a component with a narrow lead pitch, and the second predetermined component requiring, before mounting the second predetermined component, confirmation of a status of a region in which the second predetermined component is to be mounted on the substrate; and determining a third mounting condition under which (i) when a determination is made that the component is the first predetermined component, a mounting status of the first predetermined component is inspected after mounting the first predetermined component, and (ii) when a determination is made that the component is the second predetermined component, the status of the region in which the second predetermined component is to be mounted on the substrate is inspected before mounting the second predetermined component to determine whether the region is acceptable for mounting the second predetermined component, wherein said mounting condition determination method is used by a component mounter including a mounting head to mount the component on the substrate; and an inspection head to inspect the substrate, and said mounting condition determination method further includes calculating a distance from a first home position to the substrate and a distance from a second home position to the substrate, comparing the distance from the first home position to the substrate to the distance from the second home position to the substrate, and arranging, based on a result of said comparing, (i) the mounting head at one of the first and second home positions which has a shorter distance to the substrate and (ii) the inspection head at one of the first and second home positions which has a longer distance to the substrate.

* * * * *